(12) United States Patent
Ikeda et al.

(10) Patent No.: US 8,811,018 B2
(45) Date of Patent: Aug. 19, 2014

(54) ELECTRONIC APPARATUS

(75) Inventors: Kensuke Ikeda, Kanagawa (JP); Yukito Inoue, Tokyo (JP); Keiichi Aoki, Tokyo (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 182 days.

(21) Appl. No.: 13/449,592

(22) Filed: Apr. 18, 2012

(65) Prior Publication Data

US 2012/0262878 A1    Oct. 18, 2012

(30) Foreign Application Priority Data

Apr. 18, 2011  (JP) ................................ 2011-092542

(51) Int. Cl.
*H05K 7/20*            (2006.01)
(52) U.S. Cl.
USPC ...... 361/719; 361/679.54; 361/704; 361/720; 361/816; 165/80.2; 165/104.33
(58) Field of Classification Search
CPC ....... H01K 7/20; H05K 7/209; H05K 7/2201; H05K 7/09054; H05K 7/20145; H05K 7/20809; H01L 23/40; G06F 1/20; G06F 1/18; G06F 1/203; G06F 3/035447
USPC ...................... 361/679.46, 679.54, 690–697, 361/704–712, 714, 715, 719, 720, 800, 801, 361/816, 818; 257/706–727; 165/80.2, 165/80.3, 104.33, 185; 174/15.1, 15.2, 174/16.3, 252, 35 R, 35 GC, 50, 50.51, 174/50.52
See application file for complete search history.

(56) References Cited

U.S. PATENT DOCUMENTS 5,566,052 A * 10/1996  Hughes ......................... 361/704
5,946,192 A *  8/1999  Ishigami et al. ............... 361/704
6,633,485 B1 * 10/2003  Sigl et al. ...................... 361/718

(Continued)

FOREIGN PATENT DOCUMENTS

JP       2008-77434       4/2008
JP       2008-77435       4/2008

(Continued)

OTHER PUBLICATIONS

Japanese Office Action dated Dec. 11, 2012, from corresponding Japanese Application No. 2011-092542.

(Continued)

*Primary Examiner* — Michail V Datskovskiy
(74) *Attorney, Agent, or Firm* — Katten Muchin Rosenman LLP

(57) ABSTRACT

The inner edge of a hole 23 surrounding the outer circumference of a first heat sink 61 includes two edges 23a and 23b that are positioned on opposite sides to each other with the first heat sink 61 therebetween. An upper frame (shield) 20 includes spring portions 24 on one edge 23a, which is in contact with the first heat sink 61 to push the first heat sink 61 toward the other edge 23b. Further, the upper frame 20 includes, the other edge 23b, a position determining portion 25 to which the first heat sink 61 is pressed. According to the above electronic apparatus, it is possible to define the position of a metallic component by a shield covering a circuit board and to cause the metallic component and the shield to be in contact stably.

15 Claims, 13 Drawing Sheets

(56) References Cited

U.S. PATENT DOCUMENTS

| | | | |
|---|---|---|---|
| 6,673,998 B1* | 1/2004 | Wu | 174/383 |
| 6,930,891 B1 | 8/2005 | Hama et al. | |
| 7,061,773 B2* | 6/2006 | Chen | 361/816 |
| 7,254,034 B2* | 8/2007 | Bolle et al. | 361/719 |
| 7,436,664 B2* | 10/2008 | Hori et al. | 361/695 |
| 7,492,598 B2* | 2/2009 | Narasimhan et al. | 361/719 |
| 7,719,842 B2* | 5/2010 | Kreissig et al. | 361/719 |
| 7,724,526 B2* | 5/2010 | Hinze et al. | 361/704 |
| 7,986,529 B2* | 7/2011 | Lee et al. | 361/719 |
| 7,990,719 B2* | 8/2011 | Chen et al. | 361/719 |
| 2005/0048828 A1 | 3/2005 | Ho et al. | |
| 2007/0086170 A1* | 4/2007 | Liang | 361/719 |
| 2008/0074839 A1 | 3/2008 | Tamaki et al. | |
| 2010/0254086 A1 | 10/2010 | Ikeda | |

FOREIGN PATENT DOCUMENTS

| | | |
|---|---|---|
| JP | 2008-077436 | 4/2008 |
| JP | 2008-118077 | 5/2008 |
| JP | 2009-123770 | 6/2009 |
| JP | 2011-155056 | 8/2011 |

OTHER PUBLICATIONS

International Preliminary Report on Patentability and Written Opinion of the International Searching Authority dated Oct. 31, 2013, from corresponding International Application No. PCT/JP2012/060511.

* cited by examiner

ELECTRONIC APPARATUS

CROSS-REFERENCE TO RELATED APPLICATION

The present application claims priority from Japanese patent application No. 2011-092542 filed on Apr. 18, 2011, the content of which is hereby incorporated by reference into this application.

BACKGROUND OF THE INVENTION

1. Field of the Invention

The present invention relates to countermeasures against unnecessary electromagnetic radiation of an electronic apparatus.

2. Description of the Related Art

In the related art, there are electronic apparatuses in which a circuit board is covered by a metallic sheet-like shield in order to suppress unnecessary electromagnetic radiation, that is, to reduce EMI (for example, U.S. Pat. No. 6,930,891).

Electronic apparatuses include metallic components such as heat sinks for cooling an IC chip mounted on a circuit board. In the related art, there is a structure where protrusions formed on the metallic component fit into through holes formed on the shield and thereby the position of a metallic component on a shield is determined.

SUMMARY OF THE INVENTION

When a metallic component is positioned near the IC chip, the metallic component acts as an antenna and electromagnetic waves emanate from the metallic component. It is therefore desirable that the metallic component be in contact with a shield that is electrically grounded. However, sufficient contact stability cannot be obtained by merely fitting protrusions formed on the metallic component into through holes formed on the shield.

The electronic apparatus according to an aspect of the present invention includes a circuit board, a plate-like shield that covers the circuit board, and a metallic component that is arranged on the circuit board. The shield includes an edge surrounding the outer circumference of the metallic component. The edge surrounding the outer circumference of the metallic component includes two edges that are positioned on opposite sides to each other with the metallic component positioned therebetween, the shield includes, on one edge of the two edges, spring portions that are in contact with the metallic component to push the metallic component toward the other edge, and the shield includes, on the other edge, a position determining portion to which the metallic component is pressed. According to the electronic apparatus described above, it is possible to defined the position of the metallic component by the shield, and the metallic component and the shield can be made to be in contact stably.

DETAILED DESCRIPTION OF THE INVENTION

Figure 1:
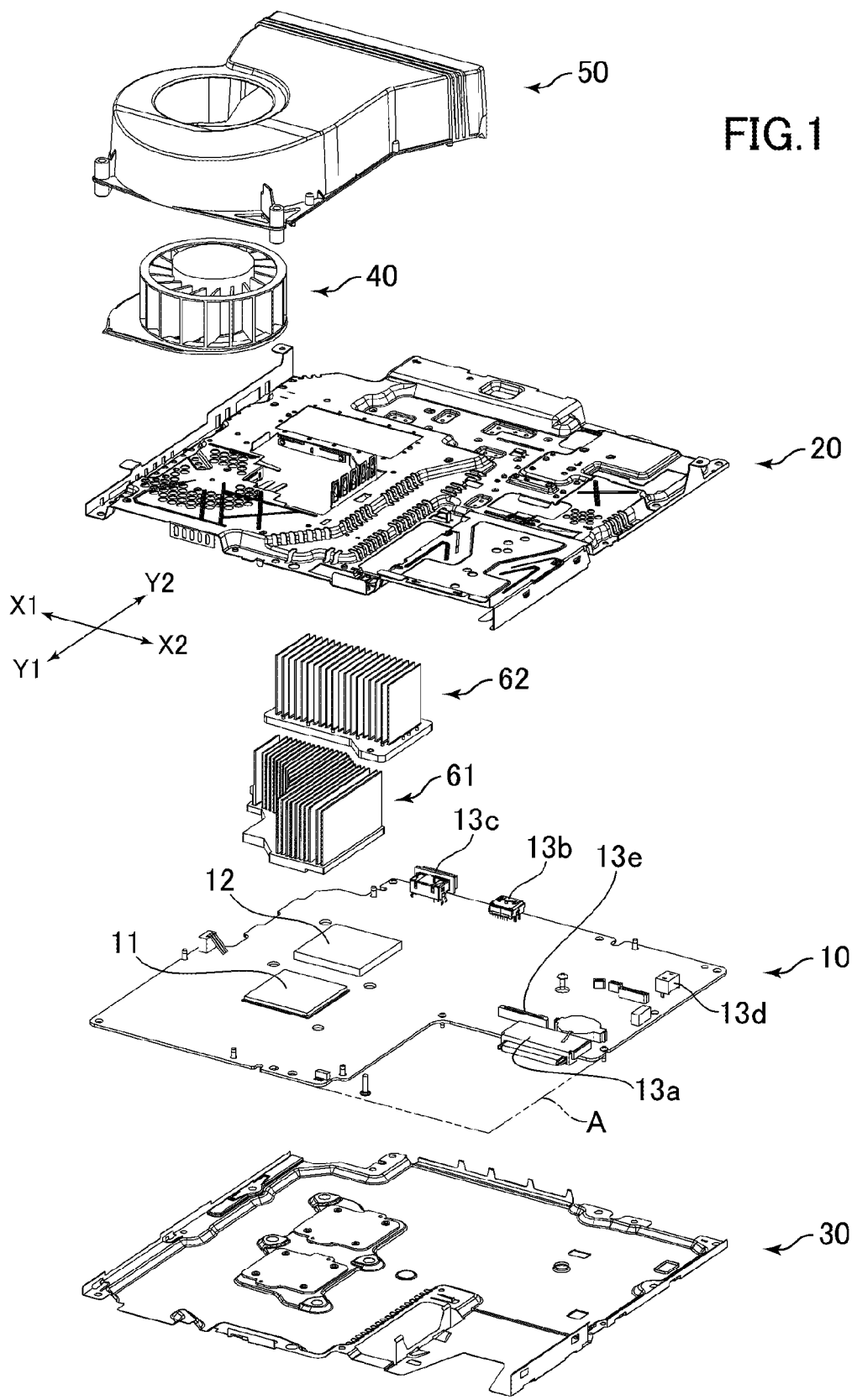
FIG. 1 is an exploded perspective diagram of parts that are built into an electronic apparatus according to an embodiment of the invention.
Figure 2:
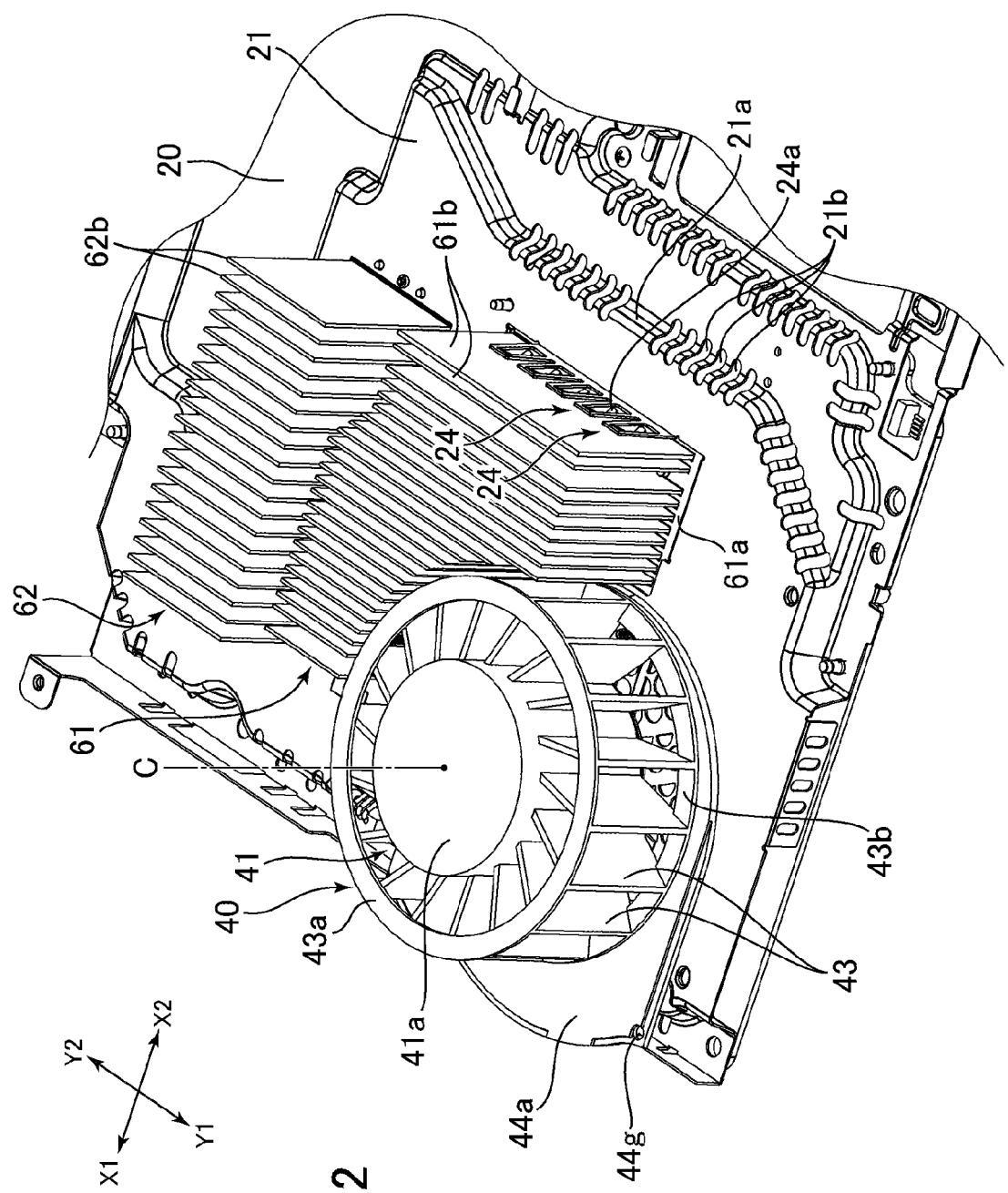
FIG. 2 is a perspective diagram that illustrates a state in which the parts illustrated in FIG. 1 excluding the cover are combined with one another.
Figure 3:
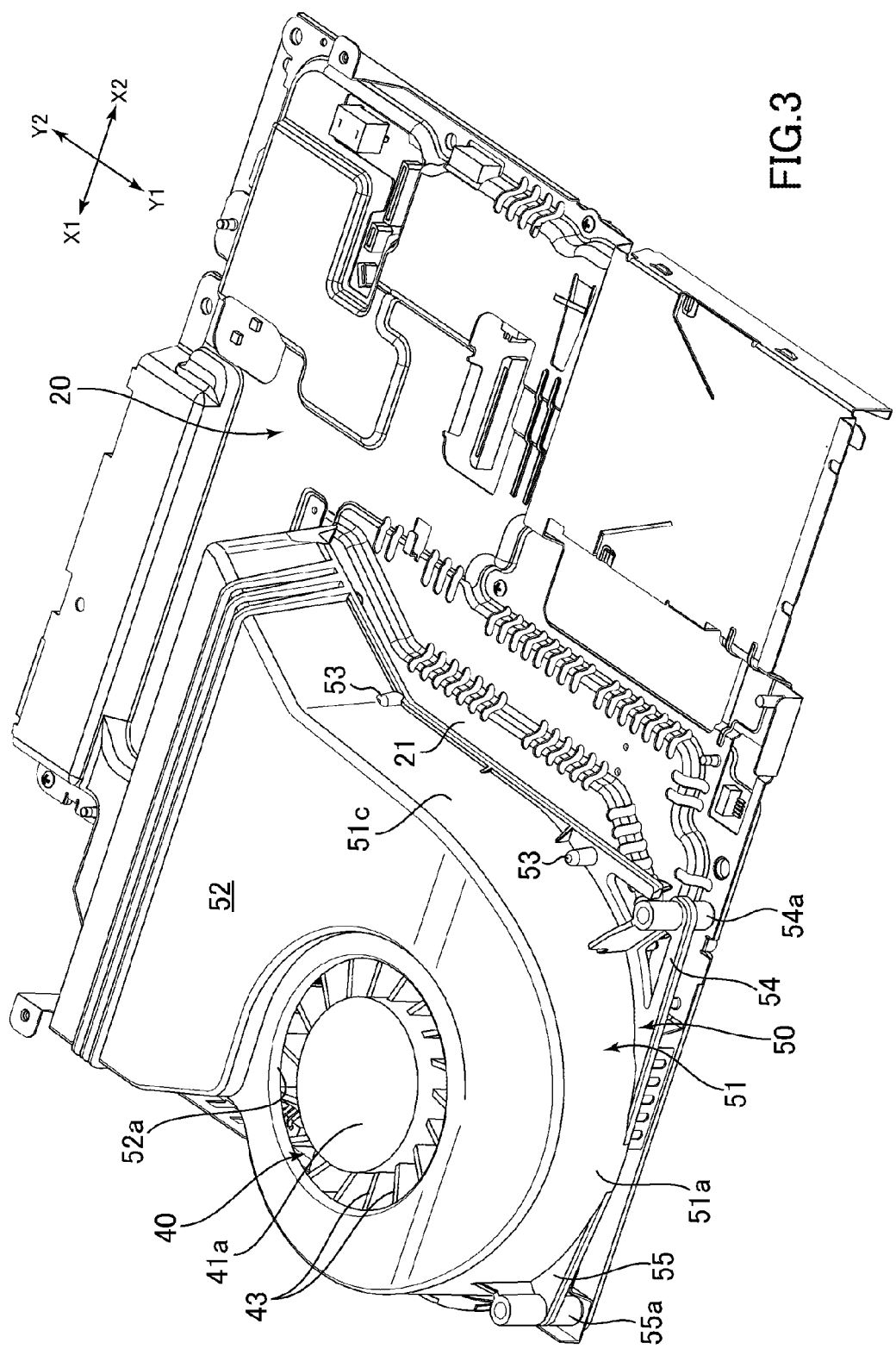
FIG. 3 is a perspective diagram that illustrates a state in which the parts illustrated in FIG. 1 are combined with one another.
Figure 4:
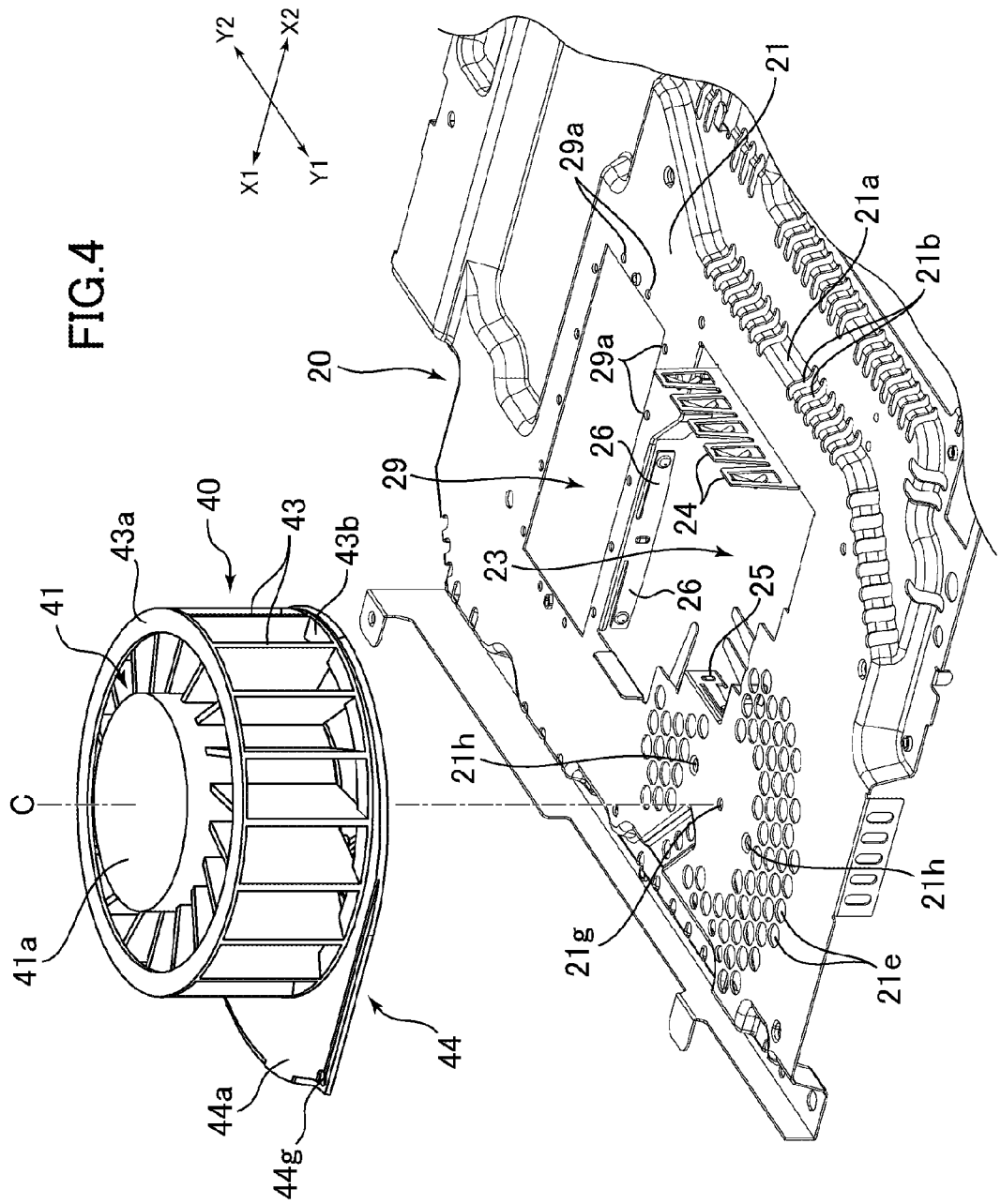
FIG. 4 is a perspective diagram of an upper frame and a cooling fan that the electronic apparatus includes.
Figure 5:
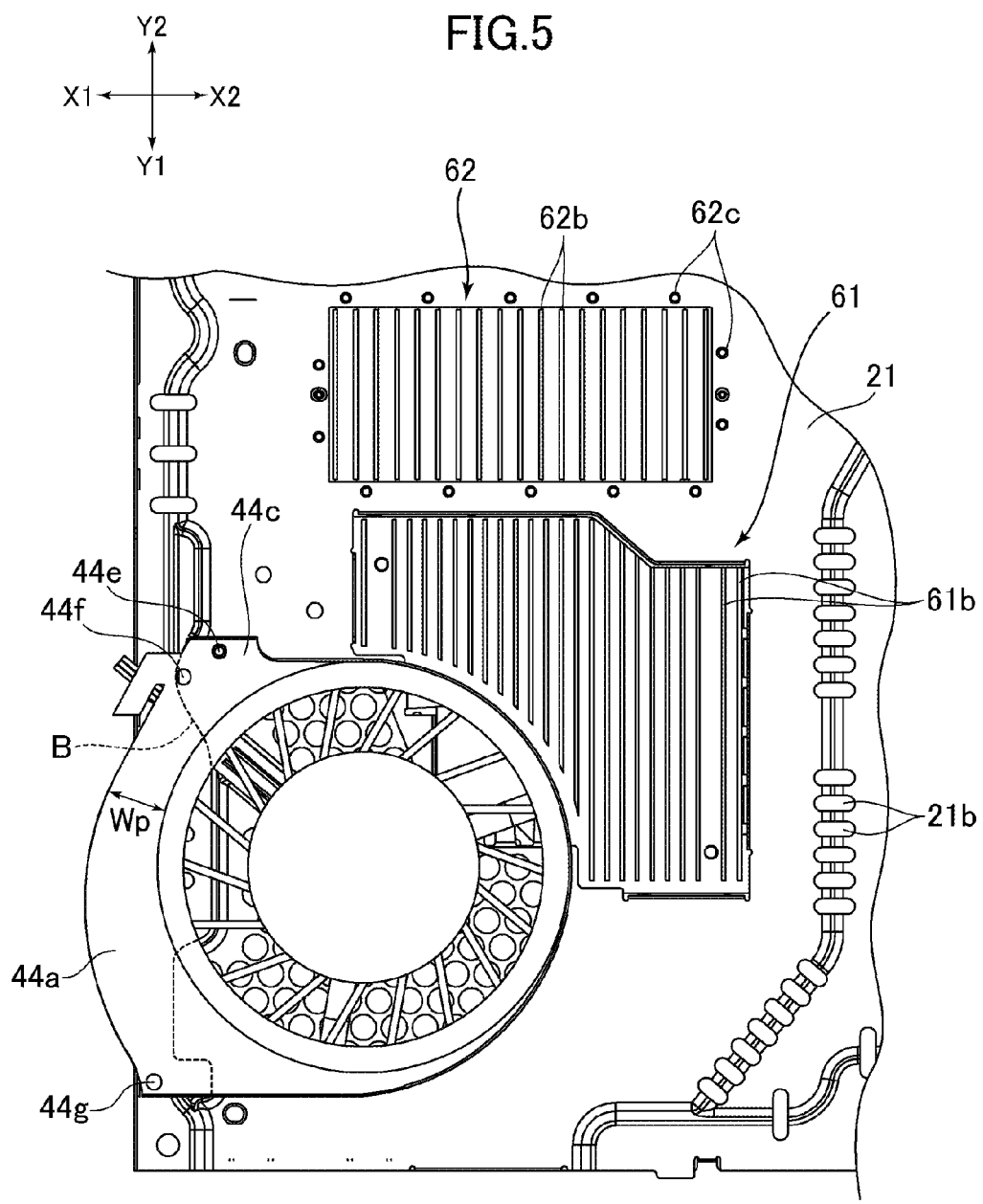
FIG. 5 is a plane diagram of the upper frame, the cooling fan, and the heat sinks of the electronic apparatus.
Figure 6:
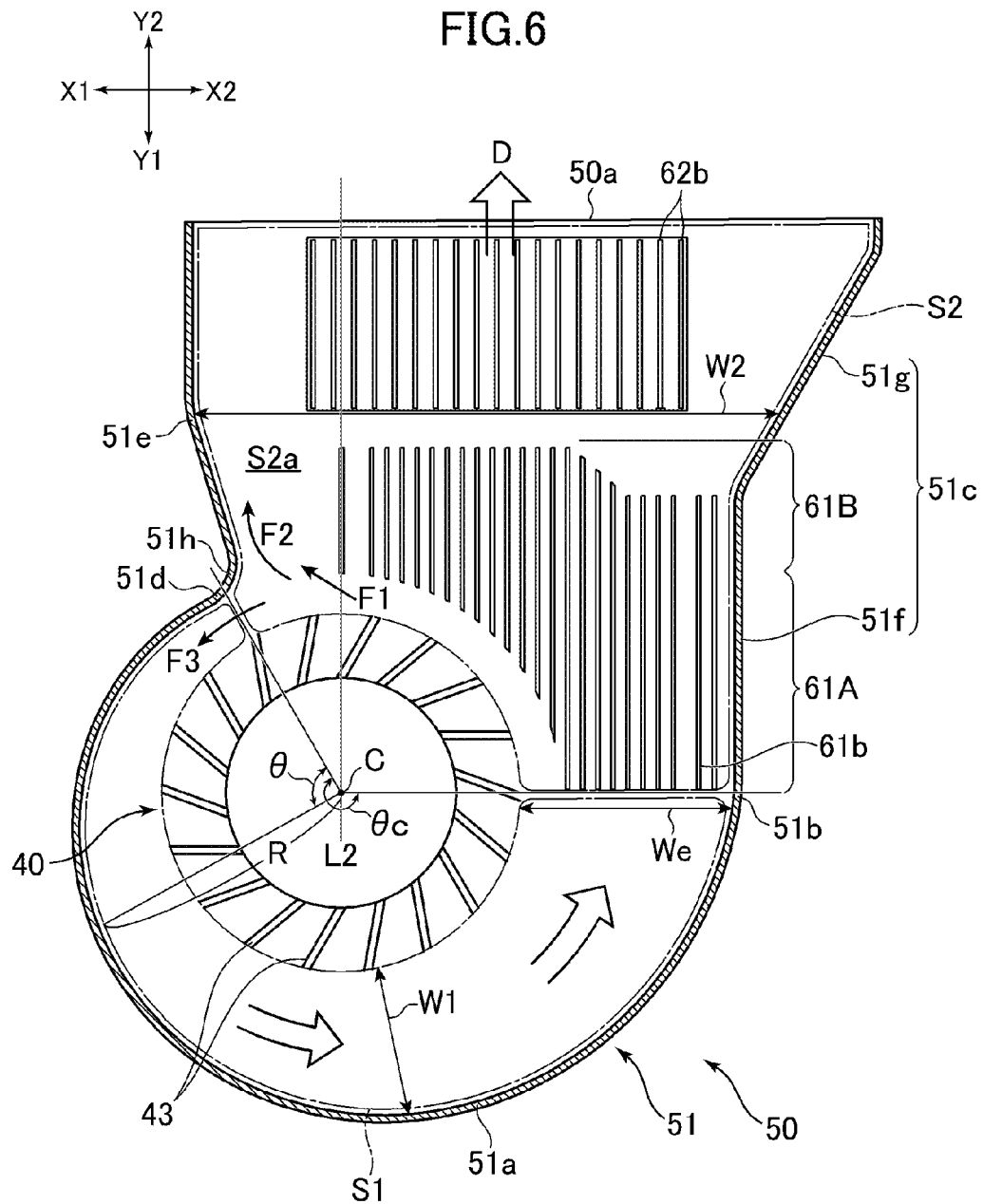
FIG. 6 is a diagram for describing the air flow paths that are formed inside the cover that the electronic apparatus includes, and illustrates a horizontal cross-section of the cover.

An embodiment of the invention will be described below with reference to the drawings. FIG. 1 is an exploded perspective diagram of the parts that are built into the electronic apparatus according to the embodiments of the invention. FIG. 2 is a perspective diagram that illustrates a state in which the parts illustrated in FIG. 1 excluding the cover are combined with one another. FIG. 3 is a perspective diagram that illustrates a state in which the parts illustrated in FIG. 1 are combined with one another. FIG. 4 is a perspective diagram of an upper frame 20 and a cooling fan 40 that the electronic apparatus includes. FIG. 5 is a plane diagram of the upper frame 20, the cooling fan 40, and heat sinks 61 and 62 of the electronic apparatus. FIG. 6 is a diagram for describing air flow paths S1 and S2 that are formed inside a cover 50 that the electronic apparatus includes, and illustrates a horizontal cross-section of the cover 50. In the description below, X1-X2 illustrated in FIG. 1 is the left and right direction and Y1-Y2 is the fore and rear direction.

As illustrated in FIG. 1, the electronic apparatus includes a circuit board 10. A plurality of electronic parts are mounted on the circuit board 10. The circuit board 10 has a plurality of (in this example, two) IC chips 11 and 12 mounted thereon. The electronic apparatus is an entertainment device such as, for example, a game device or an audio-visual device. The IC chips 11 and 12 are microprocessors for controlling the entirety of the electronic apparatus or image processing processors that generate moving image data based on information output from microprocessors.

The circuit board 10 in this example has a plurality of connectors 13*a* to 13*e* mounted thereon. The connectors 13*a* to 13*e* are used for electrically connecting the circuit board 10 to other component that are built into the electronic apparatus, or used for being connected with cables connected to peripheral apparatuses.

As illustrated in FIG. 1, the electronic apparatus includes a plate-like upper frame 20 that covers the circuit board 10. In this description, the upper frame 20 covers the upper face of the circuit board 10. The upper frame 20 has a size that corresponds to the circuit board 10. That is, the width of the upper frame 20 in the fore and rear direction and the width of the upper frame 20 in the left and right direction respectively correspond to the width of the circuit board 10 in the fore and rear direction and the width in the left and right direction of the circuit board 10. In this example, the upper frame 20 is approximately rectangular. On the other hand, the circuit board 10 has a shape in which a area of the rectangle (portion indicated by A in FIG. 1) is missing. Other device such as hard disk drive is arranged in the missing area A.

The size of the upper frame 20 is not necessarily limited to the description above, and may be a larger size than the circuit board 10. That is, one or both of the width of the upper frame 20 in the fore and rear direction and the width of the upper frame 20 in the left and right direction may be larger than the circuit board 10. Further, the shapes of the upper frame 20 and the circuit board 10 are not limited to the description above. For example, the circuit board 10 may also be a rectangle.

The upper frame 20 is a member formed by a pressing process or a bending process from one metallic plate. That circuit board 10 is fixed to the upper frame 20 by a fastening member such as bolts and screws (not shown). Therefore, the upper frame 20 functions as a member that secures the rigidity of the circuit board 10. Further, the upper frame 20 functions as a heat-releasing member to the parts mounted on the circuit board 10. The circuit board 10 and the upper frame 20 have, at positions corresponding to each other, holes formed thereon into which the fastening members are inserted. Further, the upper frame 20 is also fixed to a housing (not shown) that contains the devices that are built into the electronic apparatus. Therefore, the upper frame 20 also functions as a member for securing the rigidity of the housing. Further, as will be described in detail later, the upper frame 20 also functions as a member that blocks unnecessary electromagnetic radiation from the IC chips 11 and 12 and the like. Here, the upper frame 20 and the cooling fan 40, the cover 50, and the like illustrated in FIG. 1 are arranged within the housing of the electronic apparatus.

As illustrated in FIG. 1, the electronic apparatus in this example includes a lower frame 30 positioned to the opposite side of the upper frame 20 with the circuit board 10 therebetween. That is, the lower frame 30 covers the lower face of the circuit board 10. The upper frame 20, the circuit board 10, and the lower frame 30 are fixed to the housing by shared (that is, common) fastening members. The upper frame 20, the circuit board 10, the lower frame 30 and the housing have, at positions corresponding to one another, holes into which the fastening members are inserted. Here, the fixing structure of the circuit board 10 and the upper frame 20 is not limited to such an example, and shared fastening members may not be used.

As illustrated in FIGS. 1 and 2, the electronic apparatus includes the cooling fan 40 arranged on the upper frame 20. That is, the cooling fan 40 is arranged on the opposite side to the circuit board 10 with the upper frame 20 therebetween. Further, the electronic apparatus has the air flow paths S1 and S2 (refer to FIG. 6) through which air discharged from the cooling fan 40 passes on the upper frame 20. As illustrated in FIGS. 1 and 3, the electronic apparatus includes a cover 50 with a shape to cover the air flow paths S1 and S2. The cover 50 is disposed on the upper frame 20 and defines the air flow paths S1 and S2 together with the upper frame 20. That is, the air flow paths S1 and S2 are formed inside the cover 50, and the upper frame 20 and the cover 50 function as outer walls defining the air flow paths S1 and S2. Further, heat sinks 61 and 62 described later are arranged inside the cover 50. According to such a structure, since the heat which the upper frame 20 receives from the heat sinks 61 and 62 and the IC chips 11 and 12 which spreads to the outside of the cover 50 through the upper frame 20, the upper frame 20 can be used effectively as a heat-releasing member.

In this example, as illustrated in FIG. 2, the cooling fan 40 is arranged such that its rotation axis C is perpendicular to the circuit board 10. This arrangement of the cooling fan 40 forms, on the upper frame 20, large air flow paths S1 and S2 surrounding the periphery of the cooling fan 40. As a result, it is possible to increase, on the upper frame 20, regions cooled by the air flowing in the air flow paths S1 and S2.

The cover 50 is a substantially box-shaped member which is open toward the upper frame 20. The cover 50 is attached to the upper frame 20 such that the upper frame 20 blocks the open bottom of the cover 50. The wall defining the air flow paths S1 and S2 is constituted with the cover 50 and the upper frame 20 to thereby have a closed cross-sectional shape. Here, the term "the cross-sectional shape" is determined as the shape of cross-section of the wall taken with section surface orthogonal to the air flow direction of the air flow paths S1 and S2.

As illustrated in FIG. 3, the cover 50 includes an upper wall 52 facing the upper frame 20 in the thickness direction of the circuit board 10. Further, the cover 50 includes a side wall 51 extending downward from the edge of the upper wall 52 to the upper frame 20. That is, the side wall 51 stands on the upper frame 20 and functions as the side wall of the air flow paths S1 and S2. The lower edge of the side wall 51 is in contact with the upper frame 20. Here, the downstream end of the cover 50, that is, the downstream end of the air flow path S2 is open in the air flow direction thereof (direction indicated by D in FIG. 6).

The side wall 51 of this example has a shape of surrounding the periphery of the cooling fan 40. Specifically, as illustrated in FIG. 6, the side wall 51 includes a curved wall 51a curved so as to surround the periphery of the cooling fan 40. Further, the side wall 51 includes a first side wall 51c extending in the air flow direction (direction indicated by D in FIG. 6, rearward direction in this example) from one end 51b of the curved wall 51a (hereinafter, the one end is referred as terminal portion). Furthermore, the side wall 51 includes a second side wall 51e extending in the air flow direction D from the other end 51d of the curved wall 51a (hereinafter, the other end is referred as start portion). The curved wall 51a, the first side wall 51c, and the second side wall 51e are extending downward from the edge of the upper wall 52 to the upper frame 20.

The cover 50 covers the air flow paths S1 and S2 around the cooling fan 40 while avoiding the upper side of the cooling fan 40. That is, as illustrated in FIG. 3, the upper wall 52 has, on the upper side of the cooling fan 40, an opening 52a formed therein and having a size corresponding to the diameter of the cooling fan 40. Air is introduced into the air flow paths S1 and S2 through the opening 52a by rotationally driving the cooling fan 40. The shape of the cover 50 will be described in detail later.

As described above, the cover 50 is attached to the upper frame 20. Therefore, the upper frame 20, the cooling fan 40, and the cover 50 are able to be treated integrally during the manufacturing process of the electronic apparatus, which improves work efficiency.

In this example, as illustrated in FIG. 3, the side wall 51 includes, on the bottom edge of the side wall 51, projecting portions 54 and 55 that project parallel to the upper frame 20. The projecting portions 54 and 55 include, on the ends of the projecting portions 54 and 55, fixed portions 54a and 55a extending to the upper frame 20, respectively. The fixed portions 54a and 55a are fixed to the upper frame 20 by fastening members such as screws and bolts. As illustrated in FIG. 2, the upper frame 20 includes a mounted plate portion 21 on which the cover 50 and the cooling fan 40 are mounted. The mounted plate portion 21 is surrounded by steps 21a, and is positioned higher than other portions of the upper frame 20. That is, the mounted plate portion 21 is spaced upward from the circuit board 10. Positioning the fixed portions 54a and 55a away from the lower edge of the side wall 51 allows to make the positioning of the steps 21a freer. A plurality of through holes 21b are formed on the steps 21a. Here, as illustrated in FIG. 3, a plurality of fixed portions 53 are formed on the lower edge of the side wall 51 in addition to the projecting portions 54 and 55. The fixed portions 53 are also fixed to the upper frame 20 by the fastening members.

In this example, the cooling fan 40 and the cover 50 are offset toward one side in the left and right direction on the upper frame 20. Further, the cooling fan 40 and the cover 50 are offset toward one side in the fore and rear direction on the upper frame 20. Other devices built into the electronic apparatus are fixed to the remaining regions of the upper frame 20. For example, a power source circuit or a reading device of a recording medium may be affixed.

As illustrated in FIG. 1, the electronic apparatus includes the heat sinks 61 and 62. The electronic apparatus in this example includes the two heat sinks 61 and 62. As described above, the heat sinks 61 and 62 are arranged inside the cover 50. The heat sinks 61 and 62 are positioned over the air flow path S2 that is formed inside the cover 50 (refer to FIG. 6).

Figure 7:
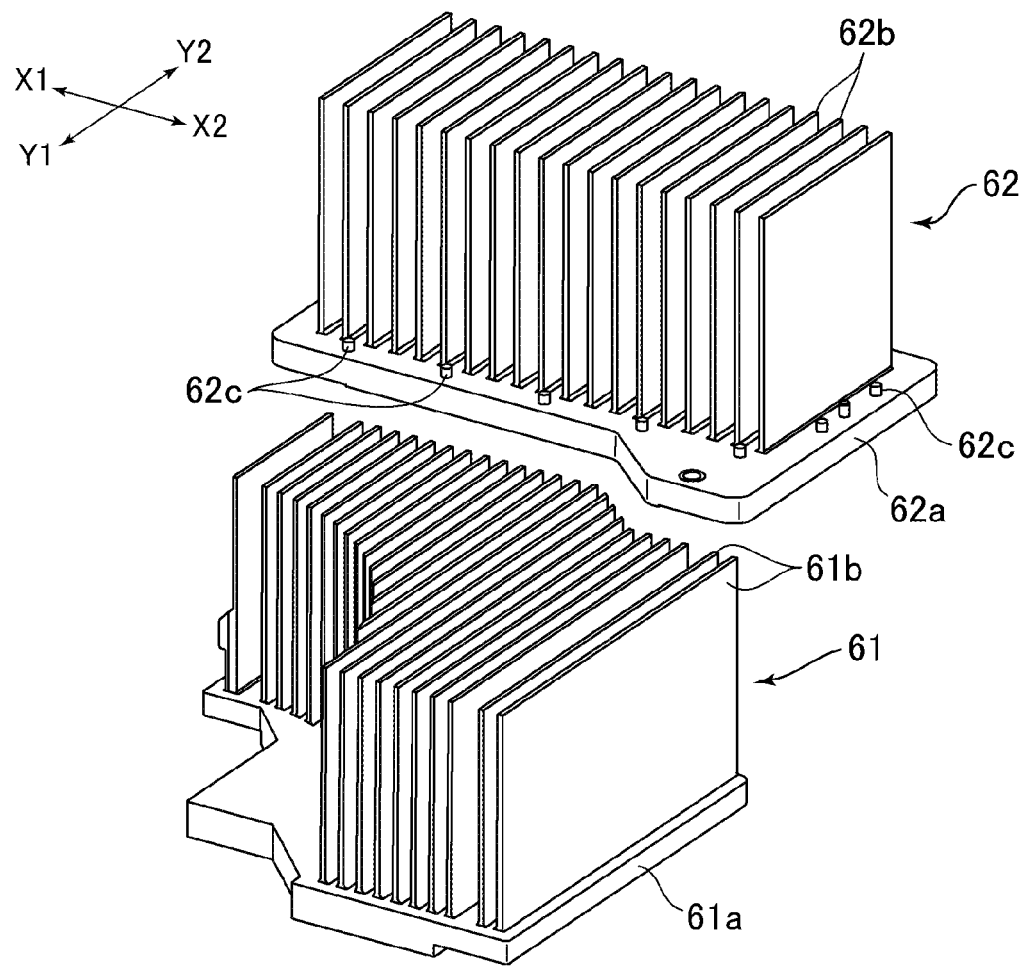
FIG. 7 is a perspective diagram of the heat sinks.

FIG. 7 is a perspective diagram of the heat sinks 61 and 62. As illustrated in the drawing, the heat sinks 61 and 62 respectively have plate-shaped heat receiving blocks 61a and 62a on the lower portions thereof. The lower faces of the heat receiving blocks 61a and 62a respectively contact the IC chips 11 and 12 mounted on the circuit board 10. The heat receiving blocks 61a and 62a are positioned closer to the circuit board 10 than the upper frame 20 is. Further, the heat sinks 61 and 62 have a plurality of fins 61b and 62b formed on the upper portions thereof, each of the plurality of fins 61b and the plurality of fins 62b having intervals between each other. The fins 61b and 62b are positioned further upward than the upper frame 20 and are positioned on the air flow path S2 formed within the cover 50. In this example, each of the fins 61b and 62b are arranged along the fore and rear direction (air flow direction indicated by D in FIG. 6).

The heat receiving block 61a and the fins 61b are a member integrally manufactured, and the heat receiving block 62a and the fins 62b are also a member integrally manufactured. For example, the heat receiving block 61a and the fins 61b are manufactured by an extrusion process of extruding material in a direction parallel to the fins 61b. Similarly, the heat receiving block 62a and the fins 62b are manufactured by an extrusion process of extruding material in a direction parallel to the fins 62b. Here, the manufacturing method of the heat receiving blocks 61a and 62a and the fins 61b and 62b is not limited to such a method. For example, the fins 61b and 62b may be manufactured by swaging boards. Further, the heat receiving blocks 61a and 62a and the fins 61b and 62b may be manufactured by casting. The upper frame 20 has a shape that avoids the heat sinks 61 and 62. In this example, the mounted plate portion 21 of the upper frame 20 has holes 23 and 29 having shapes of correspond to the shapes of the heat sinks 61 and 62 respectively. Such a shape of the upper frame 20 allows to make the heat receiving block 61a and the fins 61b integral member and to make the heat receiving block 62a and the fins 62b integral member. According to such a configuration, the structure of the electronic apparatus can be simplified compared to a structure in which the heat receiving blocks 61a and the fins 61b are manufactured separately and the heat receiving blocks 62a and the fins 62b are manufactured separately and then the heat receiving blocks 61a and 62a are fixed to the lower face of the upper frame 20 with the fins 61b and 62b arranged further upward than the upper frame 20.

As illustrated in FIG. 4, the holes 23 and 29 corresponding to the shapes of the heat sinks 61 and 62 are formed on the mounted plate portion 21 of the upper frame 20. The heat sinks 61 and 62 are respectively arranged inside the holes 23 and 29. According to that configuration, the strength of the upper frame 20 can be secured compared to a structure in which a portion of the outer edge of the upper frame 20 is cut out and the heat sinks 61 and 62 are arranged on the cut portion.

Further, the heat sinks 61 and 62 are arranged inside the holes 23 and 29, and thus the positions thereof are determined by the upper frame 20. As described above, the circuit board 10 and the upper frame 20 are fixed to each other. It is therefore possible to suppress deviations in the relative position of the IC chips 11 and 12 and the heat sinks 61 and 62.

As illustrated in FIG. 7, the heat sink 62 includes, on the heat receiving block 62a, a plurality of protrusions 62c protruding upward. As illustrated in FIG. 4, holes 29a into which the protrusions 62c fit are formed on the edge of the hole 29 of the upper frame 20. The positioning of the heat sink 62 is determined by the protrusions 62c and the holes 29a. The position determining structure of the heat sink 61 will be described later in detail.

The heat sinks 61 and 62 are pressed against the chips 11 and 12. In this example, the heat receiving blocks 61a and 62a are pulled downward by a plate spring (not shown) that is arranged on the lower side of the lower frame 30 and pressed against the IC chips 11 and 12 by the plate spring.

As illustrated in FIG. 4, the steps 21a described above are formed on the upper frame 20. The steps 21a are positioned on the outside of the side wall 51 of the cover 50, and are formed along the lower edge of the side wall 51. A plurality of through holes 21b lined up in the extending direction of the steps 21a are formed on the steps 21a. Air flows through the through holes 21b into between the circuit board 10 and the mounted plate portion 21. Further, the mounted plate portion 21 has a plurality of through holes 21e formed thereon and positioned on the lower side of the cooling fan 40. When the cooling fan 40 is rotationally driven, air flows into between the circuit board 10 and the mounted plate portion 21 through the through holes 21b. And then, the air passes through the through holes 21e and the cooling fan 40, and then flows through the air flow paths S1 and S2 in the cover 50.

In a structure of the related art in which the cooling fan 40 and the cover 50 are fixed to a plate that is separate from the upper frame, since a boundary (gap) is caused between the plate and the upper frame, it is difficult to form the steps 21a near the lower edge of the side wall 51 of the cover 50. With the electronic apparatus described here, since the cover 50 and the cooling fan 40 are fixed to the upper frame 20 which is an integral member, it becomes easy to form the steps 21a near the lower edge of the side wall 51 of the cover 50 along the lower edge of the side wall 51.

Figure 8:
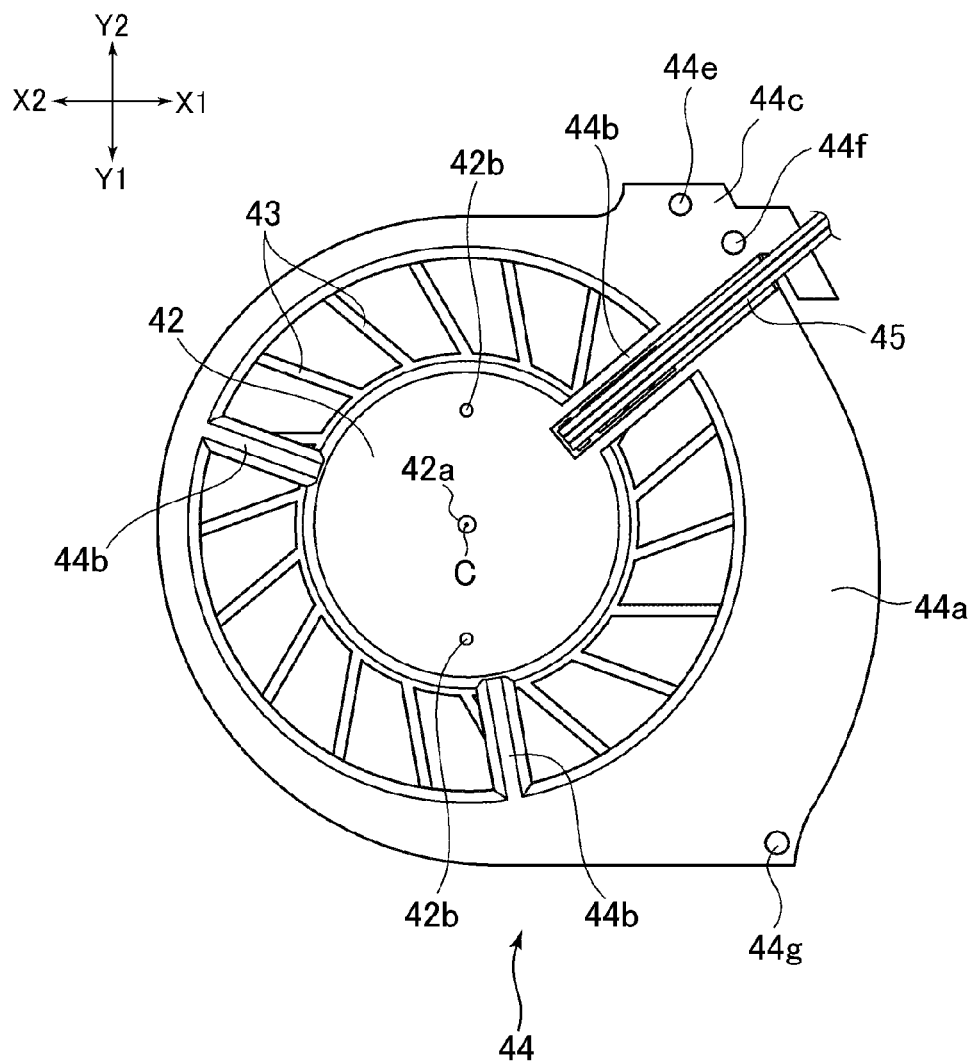
FIG. 8 is a bottom view of the cooling fan.

The fixing structure of the cooling fan 40 will be described. FIG. 8 is a bottom view of the cooling fan 40.

As illustrated in FIG. 4, the cooling fan 40 includes a rotor 41 and a plurality of fins 43. The rotor 41 is cylindrical, and the plurality of fins 43 protrude in a radial direction from the outer circumference of the rotor 41. The plurality of fins 43 are arranged around the rotation axis C at even intervals in a circumferential direction. As illustrated in FIG. 8, the cooling fan 40 includes a fixed hole 42a. The fixed hole 42a is fixed to the upper frame 20 by a fastening member such as a screw. The fixed hole 42a is positioned closer to the rotation axis C than the plurality of fins 43 are. In a structure in which fixed holes are on the outsides of the plurality of fins 43, it is necessary to provide a part with the fixed holes to the outsides of the plurality of fins 43. That part inhibits direct contact of the air flow in the cover 50 with the upper frame 20, and causes a decrease in the heat releasing efficiency of the upper frame 20. With the electronic apparatus described here, the fixed hole 42a is positioned closer to the rotation axis C than the fins 43 is. It is therefore possible to reduce the number of fixed holes that are positioned on the outsides of the plurality of fins 43, and it is possible to reduce the number and size of parts positioned outside the plurality of fins 43. As a result, the surface of the upper frame 20 (specifically the mounted plate portion 21) has a larger area capable of directly contacting with the air flow, which can improve the heat releasing efficiency of the upper frame 20.

As illustrated in FIG. 8, in this example, the fixed hole 42a is positioned on the rotation axis C. It is therefore possible to stably fix the cooling fan 40 to the upper frame 20. As illustrated in FIG. 4, the upper frame 20 has, at a position corresponding to the fixed hole 42a, into which a fastening member is inserted. The cooling fan 40 has a column-like stator arranged inside the cylindrical rotor 41. As illustrated in FIG. 8, the stator has a disk-like bottom portion 42. The fixed hole 42a is formed on the bottom portion 42.

The bottom portion 42 has protrusions 42b formed thereon at a position apart from the fixed hole 42a. In this example, two protrusions 42b are formed on the bottom portion 42. The protrusions 42b are positioned on opposite sides to each other across the fixed hole 42a. On the other hand, as illustrated in FIG. 4, the upper frame 20 has holes 21h formed thereon at positions corresponding to the protrusions 42b. The protrusions 42b fit in the holes 21h. In that structure, the positional deviation in the rotation direction of the cooling fan 40 on the upper frame 20 is suppressed.

As illustrated in FIG. 2, the rotor 41 includes an upper wall 41a, and thus the shape of the rotor 41 is a cylinder in which the top end is closed by the upper wall 41a. The stator is fitted in the rotor 41 from below. In other words, the rotor 41 is arranged such that the upper side thereof is covered by the stator. With that arrangement of the rotor 41 and the stator, the position of the rotor 41 during use of the electronic apparatus is lowered due to the weight of the rotor 41 itself. As a result, the structure for optimizing the positions of the rotor 41 and the stator in the vertical direction can become simple.

As illustrated in FIGS. 4 and 8, the cooling fan 40 includes, on the bottom thereof, a fan plate portion 44 that is parallel to the upper frame 20. The fan plate portion 44 spreads further outwardly in the radiation direction than the outer diameters of the plurality of fins 43. As described above, the upper frame 20 includes the mounted plate portion 21 that serves as the bottom of the air flow paths S1 and S2. The fan plate portion 44 is positioned further outward than the outer edge of the mounted plate portion 21 (the outer edge is a portion illustrated by a broken line B in FIG. 5). The fan plate portion 44 functions as the bottom of the air flow paths together with the mounted plate portion 21. By providing the fan plate portion 44 to the cooling fan 40, it is possible to make the positioning of the cooling fan 40 on the upper frame 20 freer.

As illustrated in FIGS. 4, 5, and 8, the fan plate portion 44 includes a spreading portion 44a on a portion thereof. The spreading portion 44a spreads further outward in the radial direction than the outer circumferences of the plurality of fins 43 and is positioned further outward than an outer edge B of the mounted plate portion 21. The spreading portion 44a has a shape that corresponds to the air flow paths formed on the periphery of the cooling fan 40 (more specifically, the first air flow path S1 described later (refer to FIG. 6)). In this example, a width W1 of the first air flow path S1 gradually increases in the circumferential direction (toward the downstream direction of the air flow path S1) around the rotation axis C. Therefore, as illustrated in FIG. 4, a width Wp of the spreading portion 44a also increases gradually toward the downstream of the air flow paths. By that shape of the spreading portion 44a, an excessive spreading of the spreading portion 44a is suppressed and the first air flow path S1 defined by a wall with a closed cross-sectional shape is formed inside the cover 50.

In this example, the fan plate portion 44 is formed on the same plane as the bottom portion 42 of the stator. Further, as illustrated in FIG. 8, the fan plate portion 44 has an approximate ring shape that surrounds the bottom portion 42. Further, the fan plate portion 44 and the bottom portion 42 are coupled with each other by a plurality of bridges 44b that extend from the bottom portion 42 in the radial direction. The spreading portion 44a spreads from a portion of the outer circumference of the fan plate portion 44. An electric wire 45 for supplying electric power to the cooling fan 40 is arranged on one bridge 44b of the plurality of bridges 44b.

As illustrated in FIG. 5, the cooling fan 40 includes a fixed plate portion 44c projecting further outward from the spreading portion 44a. A hole 44e is formed on the fixed plate portion 44c, and the fixed plate portion 44c is fixed to the upper frame 20 by a screw fitted in the hole 44e. The hole 44e is positioned on the outside of the cover 50. It is therefore possible to suppress the screw fitted in the hole 44e from becoming an obstruction in the air flow.

Furthermore, a hole 44f is formed on the fixed plate portion 44c. A hole 44g is formed on the edge of the spreading portion 44a. Protrusions formed on the lower edges of the side wall 51 of the cover 50 are fitted in the holes 44f and 44g. In that structure, the positional deviation between the cooling fan 40 and the cover 50 is suppressed.

As described above, the upper frame 20 includes a plurality of through holes 21e positioned on the lower side of the cooling fan 40 (refer to FIG. 4). Further, as described above, the upper wall 52 of the cover 50 has, on the upper side of the cooling fan 40, the opening 52a with a size corresponding to the diameter of the cooling fan 40 (refer to FIG. 3). Air is introduced toward the cooling fan 40 through the opening 52a and the through holes 21e when the cooling fan 40 is rotationally driven. The air flows out toward the air flow paths S1 and S2 from the cooling fan 40 in the radial direction.

As illustrated in FIG. 4, the cooling fan 40 includes a plate-like upper ring portion 43a on the outer circumference of the cooling fan 40. The upper ring portion 43a couples the ends of the upper edges of the plurality of fins 43 to each other. The diameter of the upper ring portion 43a corresponds to the diameter of the opening 52a of the upper wall 52, and the upper ring portion 43a is arranged in proximity to the inner edge of the opening 52a. By that configuration, it is possible to prevent wasteful air flows from being caused when the cooling fan 40 is rotationally driven. Specifically, it is possible to prevent the air introduced inside the cover 50 by the cooling fan 40 from flowing out to the outside of the cover 50 through between the inner edge of the opening 52a and the upper edges of the fins 43. In this example, the inner circumference portions of the upper ring portion 43a and the opening 52a face each other in the vertical direction with a minute clearance formed therebetween.

Further, as illustrated in FIG. 4, the cooling fan 40 of this example further includes a plate-like lower ring portion 43b.

The lower ring portion 43b couples the ends of the lower edges of the plurality of fins 43 to one another. The diameter of the lower ring portion 43b corresponds to the diameter of the fan plate portion 44. The upper ring portion 43a and the lower ring portion 43b prevent deformations of the fins 43.

[Air Flow Paths Formed Inside Cover]

The shape of the cover 50 and the air flow paths formed inside the cover 50 will be described with reference to FIG. 6.

As described above, the cover 50 covers the air flow paths S1 and S2 that are formed on the periphery of the cooling fan 40. The side wall 51 of the cover 50 surrounds a portion of the periphery of the cooling fan 40 as described above, and includes the curved wall 51a that defines the first air flow path S1 between the curved wall 51a and the outer circumference of the cooling fan 40. Further, the side wall 51 includes the first side wall 51c extending further from the terminal portion 51b that is one end of the curved wall 51a. The first side wall 51c functions as a side wall of the second air flow path S2 that is a downstream flow path continuous from the first air flow path S1. Furthermore, the side wall 51 includes the second side wall 51e facing the first side wall 51c. The second side wall 51e functions as a side wall on the opposite side to the first side wall 51c of the second air flow path S2.

The curved wall 51a is curved such that the flow path cross-sectional area of the first air flow path S1 becomes gradually larger downstream in the first air flow path S1. That is, the curved wall 51a is curved such that a distance R from the rotation axis C of the cooling fan 40 thereto becomes gradually greater downstream. The distance R between the curved wall 51a and the rotation axis C of the cooling fan 40 is shortest at the start portion 51d of the curved wall 51a, that is, at the upstream end of the curved wall 51a. The start portion 51d is positioned apart the circumference of the cooling fan 40 in the radial direction. The distance R becomes gradually greater toward the terminal portion 51b.

In this example, the curved wall 51a is curved along a logarithmic spiral (equiangular spiral) around the rotation axis C of the cooling fan 40. A function that represents the logarithmic spiral of the curved wall 51a is determined as a curved line that passes both of the position of the start portion 51d and the position of the terminal portion 51b. That is, the logarithmic spiral is represented by Formula 1 below.

$$R = a \times e^{b\theta} \qquad \text{Formula 1}$$

"a" is the distance between the start portion 51d and the rotation axis C of the curved wall 51a. "e" is a natural logarithm. "θ" is the angle between a straight line connecting each point on the curved wall 51a with the rotation axis C and a straight line connecting the start portion 51d with the rotation axis C. "b" is a coefficient, and for example, is obtained by the angle between a straight line connecting the terminal portion 51b with the rotation axis C and the straight line connecting the start portion 51d with the rotation axis C, and the distance from the terminal portion 51b to the rotation axis C.

With a structure in which the curved wall 51a is curved, the air that flows along the curved wall 51a faces resistance due to changes in the direction of the tangent of the curved wall 51a. The angle between a tangent at every point on the logarithmic spiral and the straight line connecting the portion with the rotation axis C is fixed. Therefore, the structure in which the curved wall 51a is curved along the logarithmic spiral can reduces a resistance due to changes in the direction of the tangent against the air that flow along the curved wall 51a. Therefore, the air along the curved wall 51a does not easily decelerate, and it is possible to increase the amount of air that flows through the first air flow path S1.

Alternatively, the curved wall 51a may be curved along an involute curve around the rotation axis C of the cooling fan 40 such that the flow path cross-sectional area of the first air flow path S1 becomes gradually larger toward the second air flow path S2. Even in that structure, a function that represents the involute curve of the curved wall 51a is determined as a curved line that passes through both the relative position of the starting portion 51d to the rotation axis C and the relative position of the terminal portion 51b to the rotation axis C. The curved wall 51a curved along the involute curve is similar, in its formation, to the curved wall 51a curved along the logarithmic spiral. Therefore, even in that structure where the curved wall 51a is curved along the involute curve, the air along the curved wall 51a does not easily decelerate, and it is possible to increase the amount of air that flows through the first air flow path S1.

The second air flow path S2 has a wider flow path cross-sectional area than that of the downstream end of the first air flow path S1 (the downstream end of the first air flow path S1 is a position corresponding to the terminal portion 51b of the curved wall 51a). That is, a width W2 of the second air flow path S2 is greater than a width We of the downstream end of the first air flow path S1. In this example, the width W2 becomes gradually greater downstream in the second air flow path S2 from the downstream end of the first air flow path S1. In this description, the width W2 is the width in a perpendicular direction to the air flow direction D in the second air flow path S2. Further, the air flow direction D in the second air flow path S2 is a comprehensive (macroscopic) air flow direction of air flowing in the second air flow path S2. The air flow direction D is determined by the posture of the heat sinks 61 and 62 and the fins 61b and 62b, the extending direction of the first side wall 51c and the second side wall 51e, or the opening direction of the downstream end of the first air flow path S1. In this description, the air flow path direction D is the rearward direction.

The heat sinks 61 and 62 are arranged on the second air flow path S2. In other words, the heat sinks 61 and 62 are arranged further downstream than the downstream end of the first air flow path S1. As described above, the second air flow path S2 has a larger flow path cross-sectional area than that of the downstream end of the first air flow path S1. The heat sinks 61 and 62 therefore do not easily cause a decrease in the speed of the air flow, and good cooling efficiency are obtained.

The first side wall 51c in this example includes a straight line portion 51f. The straight line portion 51f extends in a straight line from the terminal portion 51b of the curved wall 51a in the tangential direction (in this example, the air flow direction D) at the terminal portion 51b. The air that flows along the curved wall 51a can therefore flow in a straight line along the first side wall 51c without the speed thereof being greatly reduced.

Further, the first side wall 51c in this example has a slanted portion 51g extending further from the straight line 51f. The slanted portion 51g is slanted to the outside in the perpendicular direction to the air flow direction D (in this example, the slanted portion 51g is slanted in a direction indicated by X2). In that structure, the flow path cross-section area of the downstream portion in the second air flow path S2 is widen by the slanted portion 51g. As a result, the air that flows along the straight line portion 51f can pass through the second air flow path S2 smoothly.

The upstream portion of the first side wall 51c, that is, the portion of the straight line 51f close to the curved wall 51a overlaps with the rear half portion of the cooling fan 40 in the perpendicular direction to the air flow path direction D.

Accordingly, the upstream portion of the second air flow path S2 is formed between the outer circumference of the cooling fan 40 and the first side wall 51c. Therefore, the flow path cross-sectional area of the upstream portion of the second air flow path S2 becomes larger downstream by a rate of increase that is defined by the outer circumference of the rear half portion of the cooling fan 40.

The second side wall 51e that opposes the first side wall 51c is far apart from the first side wall 51c in the perpendicular direction to the air flow direction D. Specifically, as described later, the second side wall 51e is positioned on the opposite side to the first side wall 51c across a straight line L2 that passes through the rotation axis C along the air flow direction D. The downstream portion of the second air flow path S2 is defined between the first side wall 51c and the second side wall 51e.

The start portion 51d of the curved wall 51a is connected to the second side wall 51e. Air flow generated by the rotational driving of the cooling fan 40 can therefore be used effectively. Further, the start portion 51d is positioned apart from the outer circumference of the cooling fan 40 in a radial direction. Air therefore flows into the upstream end (position corresponding to the start portion 51d) of the first air flow path S1 smoothly. The entire range between the start portion 51d (coupled portion with the second side wall 51e) and the terminal portion 51b (coupled portion with the first side wall 51c) is curved along the logarithmic spiral or the involute curve.

The start portion 51d is positioned on the opposite side to the terminal portion 51b across the straight line L2 that passes through the rotation axis C of the cooling fan 40 along the air flow direction D. Referring to FIG. 6, the start portion 51d is positioned apart from the straight line L2 in the perpendicular direction to the air flow direction D. In this example, the terminal portion 51b is apart from the start portion 51d by an angle θc that is greater than 180 degrees and less than 270 degrees in a circumferential direction around the rotation axis C. That structure enables the air to flow in the second air flow path S2 efficiently. Specifically, an air flow F1 is formed at a position apart from the rotation axis C in the air flow direction D, in this example, formed at a position positioned directly rearward from the rotation axis C. The air forced out by the rotating fins 43 is ejected from the cooling fan 40 in a diagonal direction to the radial direction of the cooling fan 40. The air flow F1 therefore faces diagonally backward as illustrated in FIG. 6, and has a speed component in the air flow direction D. The air with such speed component can be supplied directly to the second air flow path S2 without going through the first air flow path S1. That is, the speed component in the air flow direction D which the air flow F1 has can be used effectively.

The second side wall 51e extends from the start portion 51d in a diagonal direction to the air flow direction D. The air flow F1 can therefore flow along the second side wall 51e smoothly.

Further, in this example, the first side wall 51c is formed along the air flow direction D, and the second side wall 51e is slanted with respect to the first side wall 51c. Therefore, the air flow cross-sectional area of the second air flow path S2 gradually becomes larger downstream between the first side wall 51c and the second side wall 51e. The downstream portion of the second side wall 51e extends in a direction along the air flow direction D.

The second side wall 51e includes a curved portion 51h on the end thereof. That is, the second side wall 51e is curved from the start portion 51d toward the outside in the perpendicular direction to the air flow direction D, and then extends in a direction diagonal to the air flow direction D. The air flow formed on the periphery of the cooling fan 40 can therefore be divided smoothly between an air flow F2 along the second side wall 51e and an air flow F3 toward the first air flow path S1.

As described above, the electronic apparatus in this example includes the two heat sinks 61 and 62. In the description below, the heat sink 61 is referred as a first heat sink and the heat sink 62 is referred as a second heat sink. The second heat sink 62 is arranged further downstream than the first heat sink 61.

The first heat sink 61 is arranged along the first side wall 51c. The air that flows along the curved wall 51a can therefore flow into the first heat sink 61 without greatly losing speed.

As described above, the first heat sink 61 includes a plurality of fins 61b. The fins 61b are arranged along the first side wall 51c (more specifically, the straight line portion 51f). That is, the fins 61b are arranged in parallel with the first side wall 51c. Further, the fins 61b are arranged to be parallel with the opening direction of the downstream end of the first air flow path S1 (in this example, the rearward direction). The air that has flowed from the first air flow path S1 can therefore pass through between the fins 61b smoothly.

In this example, the first heat sink 61 includes a downstream portion 61B that is positioned between the first side wall 51c and the second side wall 51e. Further, the first heat sink 61 extends upstream from the downstream portion 61B to thereby include an upstream portion 61A positioned between the first side wall 51c and the outer circumference of the cooling fan 40. Providing the upstream portion 61A to the first heat sink 61 leads to enlarge a portion which receives fast air flowed out of the first air flow path S1. In this example, the upstream end of the first heat sink 61 is positioned at the downstream end of the first air flow path S1.

The first heat sink 61 includes not only a portion positioned rearward from the downstream end of the first air flow path S1 but also a portion positioned rearward from the cooling fan 40, that is, a portion positioned in the air flow direction D from the cooling fan 40. It is therefore possible to cool the first heat sink 61 with both the air that flows directly out from the cooling fan 40 in the air flow direction D and the air that flows out from the first air flow path S1. In this example, the end of the first heat sink 61 (end toward the second side wall 51e) is positioned in the air flow direction D from the rotation axis C of the cooling fan 40.

Further, the first heat sink 61 in this example has a shape of surrounding a portion of the outer circumference of the cooling fan 40. That is, the front edges of the plurality of fins 61b are on a curved line along the cooling fan 40. It is therefore possible to arrange the first heat sink 61 in proximity to the cooling fan 40. As a result, the air that flows out from the cooling fan 40 flows into the first heat sink 61 before the speed drops greatly.

As described above, the second side wall 51e is connected to the start portion 51d of the curved wall 51a. The start portion 51d is positioned apart from the downstream portion 61B of the first heat sink 61 in the circumferential direction of the cooling fan 40. The second side wall 51e is also positioned apart from the downstream portion 61B in the perpendicular direction to the air flow direction D. A space S2a is therefore formed between the downstream portion 61B and the second side wall 51e. As a result, the air flow can be divided smoothly between the air flow F2 toward the space S2a and the air flow F3 toward the first air flow path S1 without being disturbed at the coupling portion between the second side wall 51e and the start portion 51d.

Further, the second side wall 51e is slanted such that the distance between the fins 61b of the first heat sink 61 and the second side wall 51e gradually increases downstream. The flow path cross-sectional area of the space S2a therefore becomes gradually larger downstream. As a result, the air flow F2 becomes even smoother.

The first heat sink 61 is offset toward the first side wall 51c from the second side wall 51e. That is, the distance between the second side wall 51e and the downstream portion 61B of the first heat sink 61 is greater than the distance between the first side wall 51c and the downstream portion 61B. It therefore becomes possible to provide air into the upstream end of the first air flow path S1 smoothly and provide, to the first sink 61, the fast air immediately after flowing out of the first air flow path S1.

As described above, the second heat sink 62 is arranged downstream of the first heat sink 61. The second heat sink 62 is also positioned apart from the second side wall 51e in the perpendicular direction to the air flow direction D. A smooth air flow can therefore be formed between the second heat sink 62 and the second side wall 51e. The air flow path formed between the first heat sink 61 and the second side wall 51e (that is, the space S2a) continues to the downstream end 50a of the cover 50.

The second heat sink 62 is positioned apart from the first side wall 51c in the perpendicular to the air flow direction D. In this example, the first side wall 51c includes the slanted portion 51g. The second heat sink 62 is positioned apart from the slanted portion 51g.

[Position Determination of Heat Sink and Measures Against Unnecessary Radiation]

Figure 9:
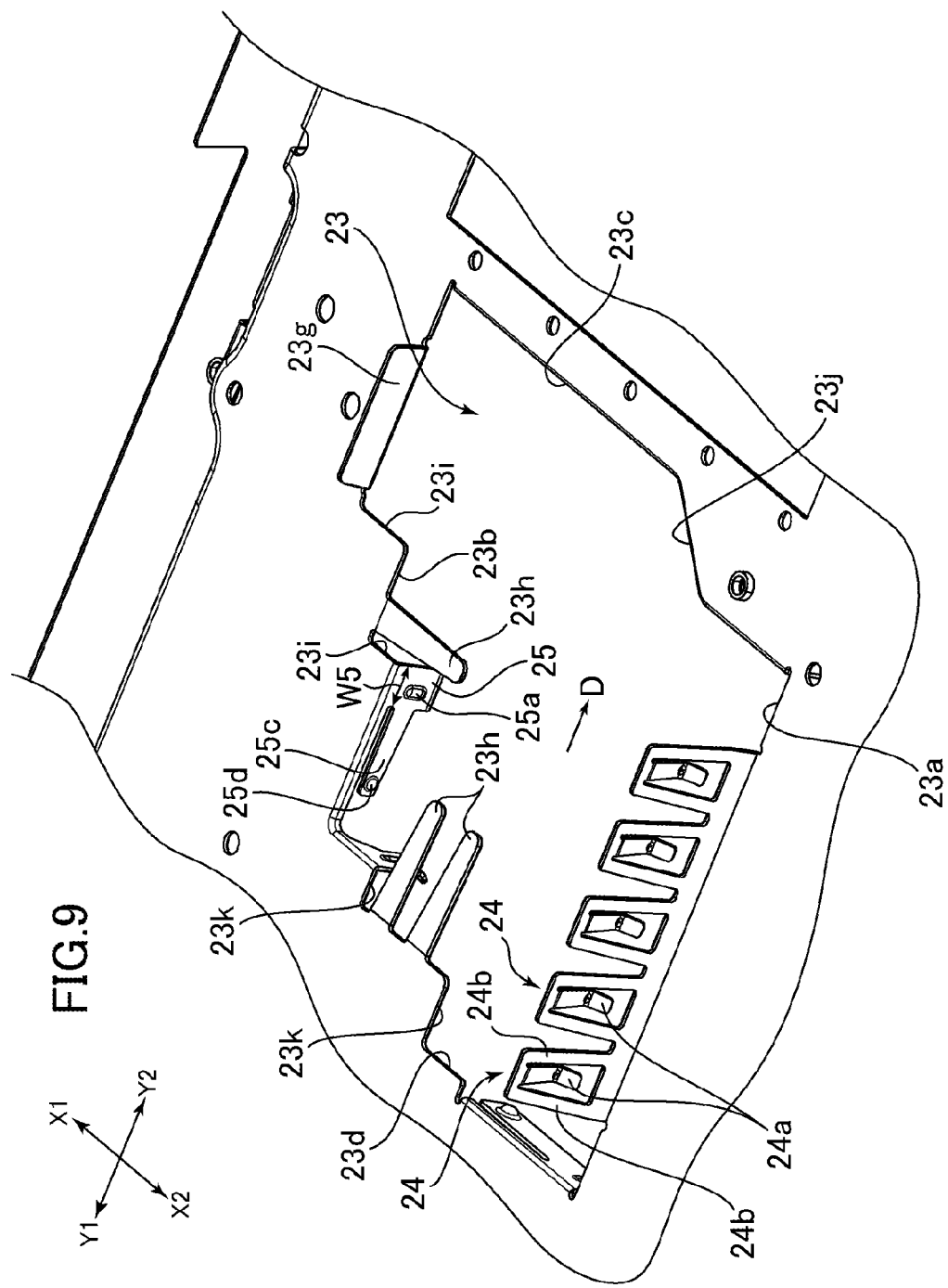
FIG. 9 is an enlarged perspective diagram of the upper frame, and illustrates a portion where a first heat sink is arranged.
Figure 10:
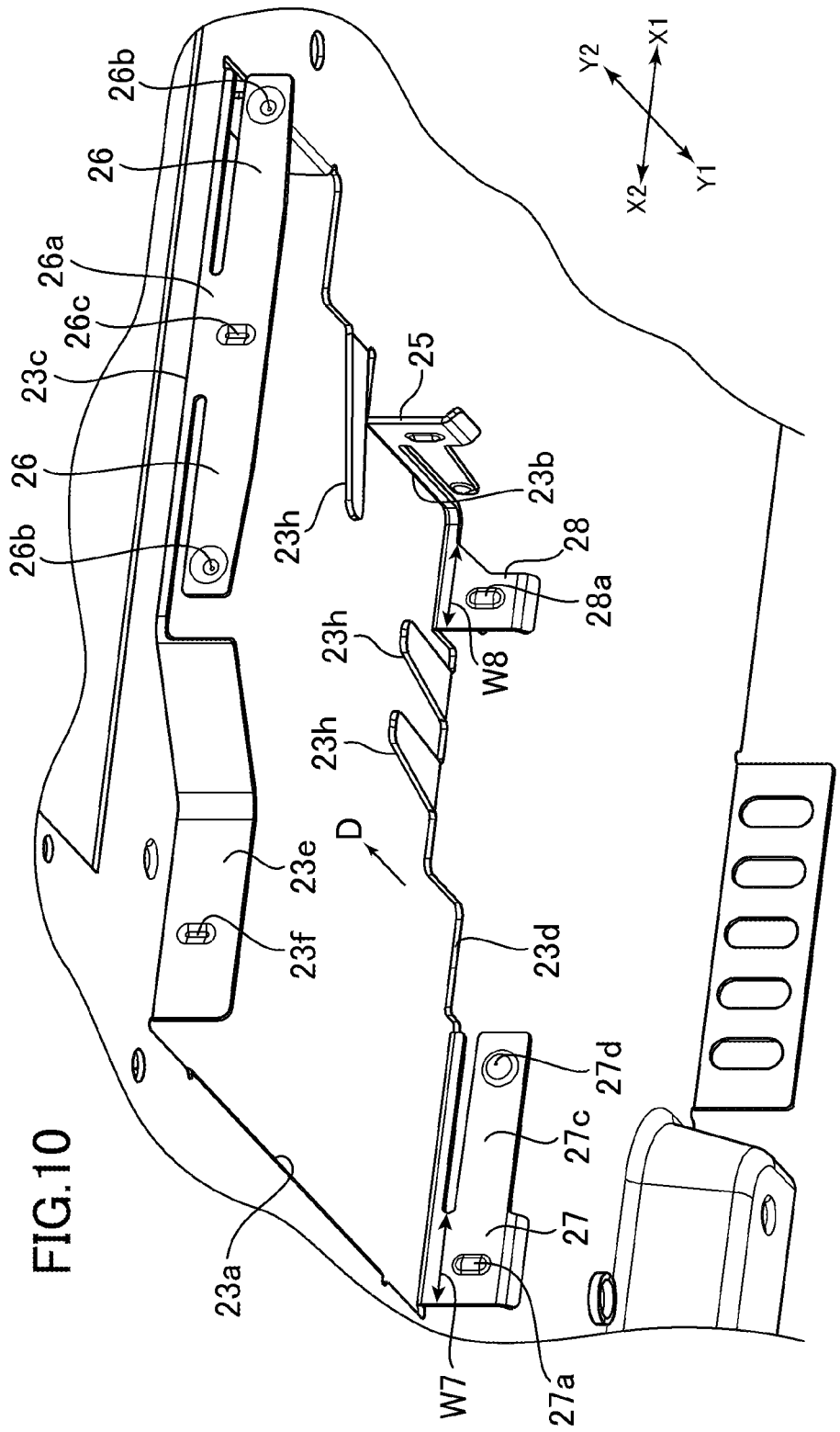
FIG. 10 is a perspective diagram of the reverse side of the portion illustrated in FIG. 9.
Figure 11:
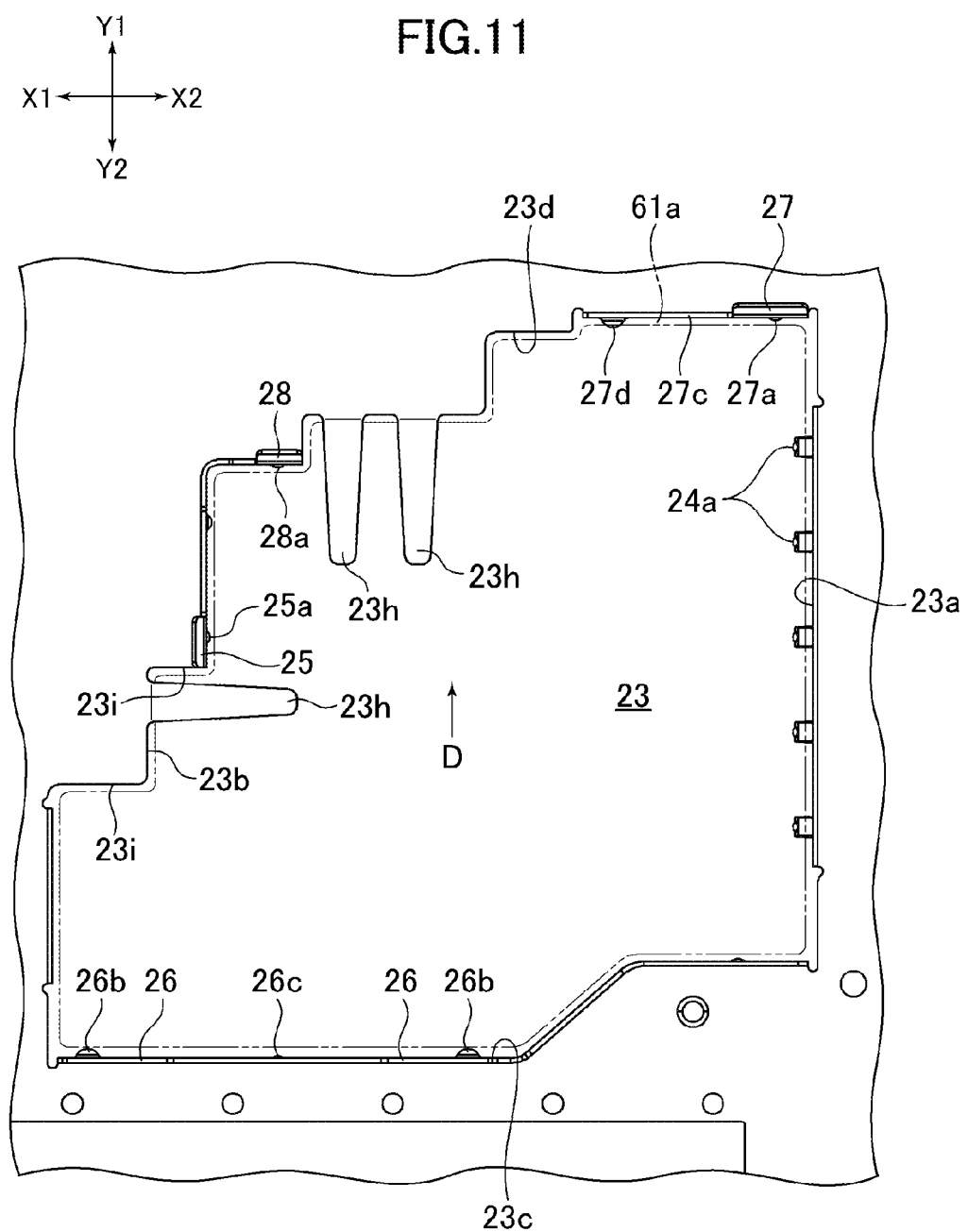
FIG. 11 is a bottom view of the upper frame.

As described above, the upper frame 20 covers the circuit board 10, and functions as a shield to block electromagnetic waves that are emitted from the circuit board 10. The position determining structure of the first heat sink 61 by the upper frame 20 and a structure for obtaining electrical contact between the first heat sink 61 and the upper frame 20 for reducing the electromagnetic waves from the first heat sink 61 will be described below. FIG. 9 is an enlarged perspective diagram of the upper frame 20, and in the drawing, the portion where the first heat sink 61 is arranged is illustrated. FIG. 10 is a perspective diagram of the reverse side of the portion illustrated in FIG. 9. FIG. 11 is a bottom diagram of the upper frame 20. Here, in these drawings, the through holes 21e described with reference to FIG. 4 are omitted.

As described above, the first heat sink 61 is arranged on the circuit board 10. More specifically, the first heat sink 61 is arranged on the IC chip 11. The upper frame 20 has a shape that avoids the first heat sink 61. In this example, a hole 23 with a shape corresponding to the first heat sink 61 is formed on the upper frame 20. The first heat sink 61 is arranged inside the hole 23, and thus the upper frame 20 has an edge that surrounds the entire outer circumference of the first heat sink 61 (that is, the inner edge of the hole 23). By arranging the first heat sink 61 inside the hole 23, as will be described later, it is possible to define the position of the first heat sink 61 in both the fore and rear direction and the left and right direction by the upper frame 20.

As illustrated in FIGS. 4 and 9, the upper frame 20 includes a first edge 23a, a second edge 23b, a third edge 23c, and a fourth edge 23d as the edge surrounding the outer circumference of the first heat sink 61 (that is, the inner edge of the hole 23). The first and second edges 23a and 23b are positioned on opposite sides to each other across the first heat sink 61. In this example, the first and second edges 23a and 23b are opposed in the perpendicular to the air flow direction D of the second air flow path S2. The third and fourth edges 23c and 23d are also positioned on opposite sides to each other across the first heat sink 61. The third and fourth edges 23c and 23d are opposed in the air flow direction D of the second air flow path S2.

In this example, the first edge 23a is formed in a straight line to match the shape of the first heat sink 61. On the other hand, steps 23i and 23i are formed on the second edge 23b to match the shape of the first heat sink 61. Further, steps 23j and 23k are respectively formed on the third edge 23c and the fourth edge 23d to match the shape of the first heat sink 61. The shapes of the edges 23a, 23b, 23c, and 23d may be changed as appropriate to match the shape of the first heat sink 61.

As illustrated in FIG. 9, the upper frame 20 includes spring portions 24 on the first edge 23a which push the first heat sink 61 toward the second edge 23b, that is, push the first heat sink 61 in the perpendicular direction to the air flow direction D (direction indicated by X1). Further, the upper frame 20 includes, on the second edge 23b, a position determining portion 25 against which the first heat sink 61 is pressed. In that structure, while the position of the first heat sink 61 is determined in the perpendicular direction to the air flow direction D, the upper frame 20 and the first heat sink 61 come into electric contact. The upper frame 20 is electrically grounded. Electromagnetic radiation from the fins 61b is therefore suppressed. In this example, the upper frame 20 includes a plurality of spring portions 24 (in this example, five spring portions 24). In this example, the position determining portion 25 is a plate-like part. The spring portions 24 and the position determining portion 25 face toward opposite sides to each other in the perpendicular direction to the air flow direction D.

Further, as illustrated in FIG. 10, the upper frame 20 includes, on the third edge 23c, spring portions 26 pushing the first heat sink 61 toward the fourth edges 23d, that is, pushing the first heat sink 61 in the air flow direction D. Further, the upper frame 20 includes position determining portions 27 and 28 against which the first heat sink 61 is pressed on the fourth edge 23d. In that structure, while the position of the first heat sink 61 is determined in the air flow direction D, the upper frame 20 and the first heat sink 61 come into electric contact. In this example, as will be described later, the upper frame 20 includes a plurality of spring portions 26 (in this example, two). The position determining portions 27 and 28 in this example are plate-like parts. The spring portions 26 and the position determining portions 27 and 28 face toward opposite sides to each other in the air flow direction D.

As illustrated in FIGS. 9 and 10, the position determining portions 25, 27, 28, the spring portions 24, 26 and the upper frame 20 are formed integrally. That is, the position determining portions 25, 27, and 28 and the spring portions 24 and 26 are formed by partially bending an original plate material to form the upper frame 20 in bending process. The position determining portions 25, 27, and 28 in this example are plate-like parts bent toward the circuit board 10.

The position determining portion 25 formed on the second edge 23b has high rigidity compared to the spring portions 24 on the opposite side thereof. That is, although the spring portions 24 are elastically deformable, the position determining portion 25 has a shape in which elastic deformation toward the outside of the hole 23 is limited. For example, a width W5 (refer to FIG. 9) of the base portion of the position determining portion 25 ("the base portion" is referred as a coupling portion between the second edge 23b and the position determining portion 25) is designed so that the position determining portion 25 cannot easily be deformed than the spring portions 24. Further, the distance between the base portion of the position determining portion 25 and a portion in which the position determining portion 25 and the first heat sink 61 come into contact (the portion is protrusion 25a described later) is designed so that the position determining portion 25 cannot easily be deformed. The position of the first heat sink 61 is therefore determined in a perpendicular to the air flow direction D by the position determining portion 25.

Similarly, the position determining portions 27 and 28 formed on the fourth edge 23d have high rigidity compared to the spring portions 26 on the opposite thereof. Specifically, although the spring portions 26 are elastically deformable, the position determining portions 27 and 28 have a shape to limit their elastic deformation toward the outside of the hole 23. For example, widths W7 and W8 (refer to FIG. 10) of the base portions of the position determining portions 27 and 28 (the base portion is referred as coupling portion between the fourth edge 23d and the position determining portions 27 and 28) are designed so that the position determining portions 27 and 28 are not easily deformed. Further, the distance between the base portions of the position determining portions 27 and 28 and portions in which the position determining portions 27 and 28 come into contact with the first heat sink 61 (the portions are protrusions 27a and 28a described later) is designed so that the position determining portions 27 and 28 are not easily deformed. The position of the first heat sink 61 in the air flow direction D is therefore determined by the position determining portions 27 and 28.

As illustrated in FIG. 9, the spring portions 24 formed on the first edge 23a protrude upward from the first edge 23a. That is, the spring portions 24 extend in the opposite direction to the direction in which the circuit board 10 is arranged from the upper frame 20. Furthermore, the spring portions 24 push the fin 61b positioned on the end of the plurality of fins 61b of the first heat sink 61. It is therefore easy to secure the lengths (heights) of the spring portions 24.

In this example, each spring portion 24 includes two support portions 24b that extend upward. The two support portions 24b extend upward from two positions distant from each other in a direction along the first edge 23a (in this example, the direction is the air flow direction D). Further, each spring portion 24 includes a plate spring-like contact arm portion 24a positioned between the two support portions 24b. The contact arm portions 24a is pressed against the fins 61b (refer to FIG. 2). In the structure, the contact arm portion 24a can be protected by the support portions 24b. For example, external force can be suppressed from acting on the contact arm portion 24a by the manufacturing process of the electronic apparatus.

In this example, the upper ends of the two support portions 24b are coupled with each other. The contact arm portion 24a extends downward from the upper end of the support portions 24b and is slanted toward the fins 61b. The contact arm portion 24a has a lower portion in contact with the fins 61b. The contact arm portion 24a is elastically deformable using the base portion (upper end) thereof as the origin of the deformation. In that structure, the contact arm portion 24a is surrounded by the two support portions 24b and the contact arm portion 24a can be effectively protected by the two support portions 24b.

As will be described later, the position determining portion 25 projects from the second edge 23b of the upper frame 20 toward the circuit board 10. On the other hand, the support portions 24b extend upward from the first edge 23a of the upper frame 20, and as described above, the contact arm portion 24a extends downward from the upper ends of the support portions 24b, that is, extends toward the upper frame 20. Furthermore, the lower portion of the contact arm portion 24a, that is, the portion close to the upper frame 20, is in contact with the fins 61b. Therefore, compared to a structure in which the contact arm portion 24a extends upward and its upper portion contacts the fins 61b, the difference in height between the position where the contact arm portion 24a contacts the fins 61b and the position where the position determining portion 25 contacts the first heat sink 61 is reduced, and thus the momentum generated on the first heat sink 61 can be suppressed.

As described above, a plurality of spring portions 24 are formed on the first edge 23a. The force to press the first heat sink 61 against the position determining portion 25 is therefore increased. The first edge 23a in this example is parallel to the air flow path direction D. The plurality of spring portions 24 are lined up in a direction parallel to the fins 61b, that is, a direction parallel to the air flow direction D. It is therefore possible to suppress the spring portions 24 from causing air resistance. Here, as described above, the first side wall 51c of the cover 50 is formed along the fins 61b. The plurality of spring portions 24 are therefore also lined up along the first side walls 51c.

As illustrated in FIG. 9, the position determining portion 25 projects from the second edge 23b toward the circuit board 10. Specifically, the position determining portion 25 is bent toward the circuit board 10. It is therefore possible to suppress the position determining portion 25 from becoming an obstruction to the air flow. In particular, in this example, it is possible to suppress the position determining portion 25 from becoming an obstruction against the air that flows through the space S2a (refer to FIG. 6) between the first heat sink 61 and the second side wall 51e. The height of the position determining portion 25 in the up and down direction corresponds to the distance between the upper frame 20 (in this example, the mounted plate portion 21) and the circuit board 10.

As illustrated in FIG. 10, the spring portions 26 protrude from the third edge 23c toward the circuit board 10. Further, the position determining portions 27 and 28 project from the fourth edge 23d toward the circuit board 10. That is, the spring portions 26 and the position determining portions 27 and 28 are bent toward the circuit board 10. Since both the spring portions 26 and the position determining portions 27 and 28 are folded on the same side with respect to the upper frame 20, it is possible to suppress the momentum generated on the first heat sink 61. Further, since the spring portions 26 and the position determining portions 27 and 28 are bent to opposite sides to the air flow paths, it is possible to prevent the spring portions 26 and the position determining portions 27 and 28 from obstructing the air flow. Here, the heights of the spring portions 26 and the position determining portions 27 and 28 in the up and down direction correspond to the distance between the upper frame 20 (in this example, the mounted plate portion 21) and the circuit board 10.

The heat receiving block 61a of the first heat sink 61 is positioned toward the circuit board 10 from the upper frame 20. A side surface of the heat receiving block 61a is pressed against the position determining portion 25. Since the heat receiving block 61a is a block of metal, the heat receiving block 61a has high rigidity compared to the fins 61b. Therefore, compared to a structure where the position determining portion 25 is in contact with the fins 61b, the precision of the positioning of the first heat sink 61 can be improved. Similarly, a side surface of the heat receiving block 61a is also pressed against the position determining portions 27 and 28. In the manufacturing process of the first heat sink 61, there may be a case where mechanical processes such as cutting are applied to the outer circumference of the heat receiving block 61a. It is possible to obtain generally high processing precision in mechanical processing. Pressing the side surfaces of the heat receiving block 61a against the position determining portions 25, 27, and 28 enables the first heat sink 61 to obtain even higher precision of positioning thereof.

As illustrated in FIG. 10, the spring portions 26 include a base portion 26a bent toward the circuit board 10. The spring portions 26 are plate springs extending from the base portion 26a in a direction parallel to the circuit board 10. The spring portions 26 extend from the base portion 26a thereof along a side surface of the heat receiving block 61a. The spring portions 26 are elastically deformable using the base portion 26a thereof as the origin of the deformation. The upper frame 20 in this example includes two spring portions 26 that extend in opposite directions to each other from a shared base portion 26a. Ends of the two spring portions 26 have are in contact with a side surface of the heat receiving block 61a. Since it is therefore possible to increase the force to push the heat receiving block 61a and push the wide range of the side surface of the heat receiving block 61a, it is possible to suppress the rotation of the first heat sink 61 inside the hole 23. The two spring portions 26 are connected to the third edge 23c via the shared base portion 26a thereof.

In this example, the third edge 23c is an edge that is positioned more downstream in the air flow paths than the fourth edge 23d. Therefore, the spring portions 26 push the first heat sink 61 upstream. Therefore, compared to a structure in which the spring portions 26 push the first heat sink 61 downstream, it is possible to decrease the gap between the heat receiving block 61a of the first heat sink 61 and the fourth edge 23d positioned upstream. As a result, the air to flow into the second air flow path S2 and then hit the fins 61b can be suppressed from flowing to the back side of the upper frame 20 through such a gap.

The spring portion 26 includes, its distal end, protrusion 26b protruding to a side surface of the heat receiving block 61a so as to be in contact with the side surface of the heat receiving block 61a. According to that structure, since the heat receiving block 61a and the spring portions 26 are stable in their contact positions, compared to a structure in which there are no such protrusions 26b. And thus, the stability of the electrical connection between the first heat sink 61 and the upper frame 20 can be secured.

As illustrated in FIG. 9, the position determining portion 25 includes a protrusion 25a protruding to the first heat sink 61, that is, protruding to a side surface of the heat receiving block 61a. The side surface of the heat receiving block 61a is in contact with the protrusion 25a. As illustrated in FIG. 10, protrusions 27a and 28a protruding toward a side surface of the heat receiving block 61a are also formed on the position determining portions 27 and 28 formed on the fourth edge 23d. The side surface of the heat receiving block 61a is in contact with the protrusions 27a and 28a. According to that structure, since the heat receiving block 61a and the position determining portions 25, 27, and 28 are stable in their contact positions, compared to a structure where the entirety of each of the plate-like position determining portions 25, 27, and 28 is in contact with a side surface of the heat receiving block 61a. And thus, the precision of the positioning of the first heat sink 61 and the stability of the electrical connection between the first heat sink 61 and the upper frame 20 can be improved.

As illustrated in FIG. 9, the upper frame 20 includes a plate spring-like spring portion 25c extending from the position determining portion 25 in a direction parallel to the circuit board 10, in other words, that extending along a side surface of the heat receiving block 61a. The spring portion 25c includes, on the end of the spring portion 25c, a protrusion 25d that is pressed against a side surface of the heat receiving block 61a. Further, as illustrated in FIG. 10, the upper frame 20 includes a plate spring-like spring portion 27c extending from the position determining portion 27 in a direction parallel to the circuit board 10, in other words, extending along a side surface of the heat receiving block 61a. The spring portion 27c includes, on the end thereof, a protrusion 27d pressed against a side surface of the heat receiving block 61a. Rattling of the first heat sink 61 or the rotation of the first heat sink 61 inside the hole 23 is suppressed by the spring portions 25c and 27c. The elasticity of the spring portion 25c is less than the elasticity of the contact arm portions 24a of the plurality of spring portions 24 formed on the opposite side thereof. The first heat sink 61 is therefore pressed against the protrusion 25a of the position determining portion 25 by the contact arm portions 24a. Further, the elasticity of the spring portion 27c is less than the elasticity of the spring portion 26 formed on the opposite side thereof. The first heat sink 61 is therefore pressed against the protrusions 27a and 28a of the position determining portions 27 and 28 by the spring portions 26.

As described above, a plurality of spring portions 24 are formed on the first edge 23a. As illustrated in FIGS. 9 and 11, the protrusion 25a of the position determining portion 25 is positioned to the opposite of a position between two spring portions 24 positioned on both ends out of the plurality of spring portions 24. In that structure, it is possible to suppress momentum from being generated on the first heat sink 61 by the elasticity of the plurality of spring portions 24. In particular, the protrusion 25a is positioned at an opposite position to the intermediate position of the plurality of spring portions 24. That is, the intermediate position of the plurality of spring portions 24 and the protrusion 25a are positioned on a common straight line perpendicular to the air flow direction D.

As illustrated in FIGS. 10 and 11, the protrusion 28a of the position determining portion 28 is positioned opposite to a position between the two spring portions 26. In that structure, momentum can be suppressed from being generated on the first heat sink 61 by the elasticity of the spring portions 26. In particular, the protrusion 28a is positioned opposite to the intermediate position of the protrusions 26b of the two spring portions 26. In other words, the intermediate position of the protrusions 26b of the spring portions 26 and the protrusion 28a are positioned on a common straight line along the air flow direction D.

As described above, the two position determining portions 27 and 28 are formed on the fourth edge 23d. As illustrated in FIGS. 10 and 11, the position determining portions 27 and 28 are apart from each other in the perpendicular direction to the air flow direction D. According to that structure, the positioning of the first heat sink 61 inside the hole 23 is stabilized. In this example, the position determining portion 28 is formed on one end of the fourth edge 23d, and the position determining portion 27 is formed on the other end. The position determining portion 27 is shifted in the perpendicular direction to the air flow direction D with respected to the two spring portions 26 formed on the third edge 23c.

As illustrated in FIG. 10, in addition to the two spring portion 26, an auxiliary wall 23e is formed on the third edge 23c. The auxiliary wall 23e has a protrusion 23f protruding to a side surface of the heat receiving block 61a. Further, a protrusion 26c is also formed on the common base portion 26a of the two spring portions 26 formed on the third edge 23c. According to that a structure, even in a case where the first heat sink 61 is arranged toward the third edge 23c by a manufacturing fault, the contact position between a side surface of the heat receiving block 61a and the upper frame 20 is stabilized. As a result, the stability of the electrical connection between the first heat sink 61 and the upper frame 20 can be improved.

As illustrated in FIG. 9, the second edge 23b includes a wall 23g bent to the upper side, that is, bent to the opposite side to the circuit board 10. The wall 23g can increase the strength of portions of the upper frame 20 which are close to the wall 23g Further, The wall 23g facilitates the manufacture process of fitting the first heat sink 61 into the hole 23 from the lower side of the upper frame 20.

As illustrated in FIG. 9, a long thin plate 23h extending inwardly inside the hole 23 and arranged to be approximately parallel to the upper frame 20. When fitting the first heat sink 61 inside the hole 23 from the lower side of the upper frame 20, the first heat sink 61 can be prevented from popping out upward from the hole 23.

[Vibration Reducing Structure of Heat Sink Fins]

Figure 12:
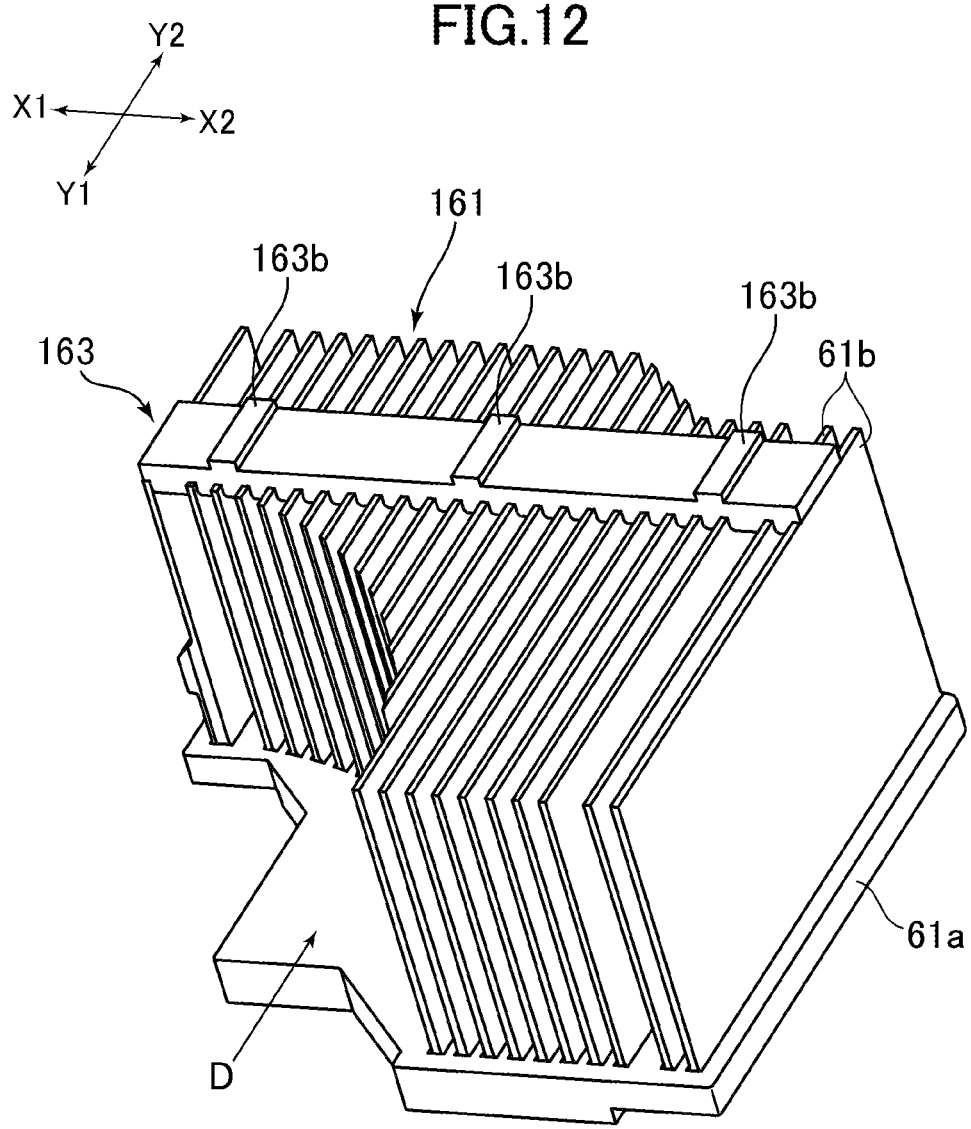
FIG. 12 is a perspective diagram that illustrates a modification of the first heat sink.
Figure 13:
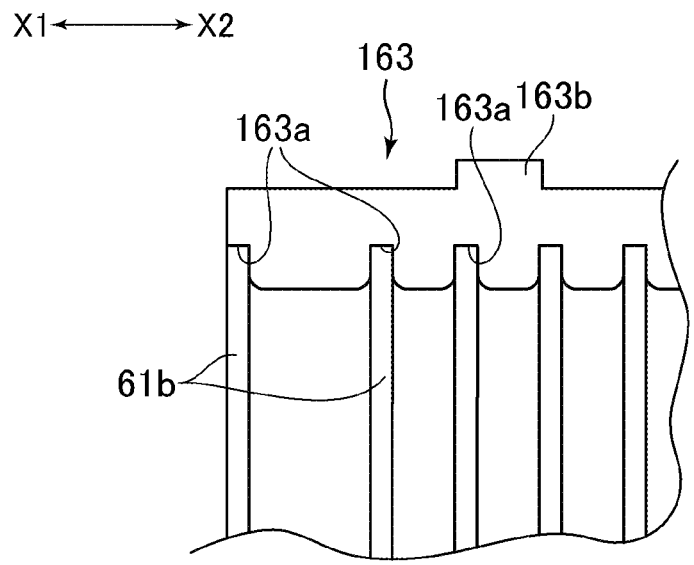
FIG. 13 is an enlarged front view of the first heat sink illustrated in FIG. 12; and, FIG. 14 is a perspective diagram that illustrates still another modification of the first heat sink.

A structure for reducing the vibrations of the fins 61b of the first heat sink 61 will be described. FIG. 12 is a perspective diagram of a first heat sink 161 that is a modification of the first heat sink 61. FIG. 13 is an enlarged front view of the first heat sink 161. In the description below, the same references are given to parts that are the same as parts described thus far, and detailed description thereof will be omitted. The arrangement of the first heat sink 161 within the electronic apparatus is the same as that of the first heat sink 61 described above.

As illustrated in FIG. 12, similarly to the first heat sink 61 described above, the first heat sink 161 includes a plate-like heat receiving block (base) 61a and a plurality of fins 61b extending upward from the heat receiving block 61a. The plurality of fins 61b are lined up in a direction along the heat receiving block 61a, that is, in the perpendicular direction to the air flow direction D, leaving gaps therebetween.

Further, the first heat sink 161 includes a coupling member 163 that is separately manufactured member from the heat receiving block 61a or the fins 61b. The coupling member 163 is attached to the edges of the plurality of fins 61b. In other words, the coupling member 163 is attached to the edges of the fins 61b. In this example, the coupling member 163 is positioned apart upward from the heat receiving block 61a, and is attached to the upper edges of the plurality of fins 61b, that is, the opposite edges to the heat receiving block 61a. The air flow in the air flow paths S1 and S2 is formed by each fin 43, and thus the air flow pulsates microscopically due to the rotation speed of the cooling fan 40. Attaching the coupling member 163 on the fins 61b can deduce the vibrations of the fins 61b due to the air flow from the cooling fan 40. Further, since the coupling member 163 is attached to the upper edges of the fins 61b, the coupling member 163 can be suppressed from obstructing the air flow.

As described with reference to FIGS. 9 to 11, the heat receiving block 61b and the fins 61a are in contact with the upper frame 20. Specifically, the heat receiving block 61b and the fins 61a are in contact with the spring portions 24 and 26 and the position determining portions 25, 27, and 28. Reducing the vibrations of the fins 61b leads to reduce vibrations transmitted via the upper frame 20 to other devices that are arranged on the upper frame 20, for example, a reading reproduction device of storage media or an external storage device that is arranged in the region A illustrated in FIG. 1.

Depending on the rotation speed of the cooling fan 40, the plurality of fins 61b of the first heat sink 161 cause sympathetic vibrations by the pulsations of the air flow, between the fins 61b and other members arranged in the electronic apparatus, or between the fins 61b. Specifically, under pulsations of the air flow is caused by the cooling fan 40 driven at a certain rotation speed, the thicknesses, sizes, and shapes of the fins 61b designed for meeting a demand in the cooling efficiency for the first heat sink 161 causes sympathetic vibrations between the pulsations of the air flow and the fins 61b, between two fins 61b, between the fins 61b and the upper frame 20, or between other devices that mounted on the upper frame 20 and the fins 61b. The coupling member 161 attached to the fins 61b can reduce the generation of the sympathetic vibrations.

The coupling member 161 is formed by a material with a buffering function that can reduce the vibrations of the fins 61b. In other words, the coupling member 161 is formed by a material that is able to change the natural frequency of the fins 61b. For example, the coupling member 161 is formed by a material with elasticity, stretchability, and flexibility, for example, by a resin such as elastomer or a resin tape. Further, the coupling member 161 may be formed by a resin with rigidity such as a plastic. Furthermore, the coupling member 161 may be polystyrene foam or a paper material such as cardboard. Here, the coupling member 161 may be an insulating material or a conductive material that can reduce unnecessary radiation (conductive rubber).

The coupling member 163 has a shape into which edges of the plurality of fins 61b fit. In this example, the coupling member 163 is a long thin member in the direction in which the fins 61b are lined up (left and right direction). As illustrated in FIG. 13, a plurality of grooves 163a are formed on the lower face thereof. The plurality of grooves 163a are lined up in the lining direction of the fins 61b, and the positions of the grooves 163a respectively correspond to the positions of the fins 61b. Furthermore, the upper edges of the fins 61b are fitted into the grooves 163a. With that structure, the upper edges of the fins 61b are coupled with one another. In this example, the widths of the grooves 163a equate to the thicknesses of the fins 61b. With that structure, the vibrations of the fins 61b can be prevented more effectively. The shape of coupling the fins 61b is not limited thereto.

For example, protrusions may be formed on the edges of the fins 61b, and the coupling member 163 may have holes thereon into which the protrusions fit respectively. Further, an adhesive may be applied to the inner faces of the grooves 163a or the entire lower face of the coupling member 163. By that structure, the generation of vibrations of the fins 61b can be suppressed more reliably.

The plurality of fins 61b include a plurality of fins 61b having different lengths from one another in a direction along the plurality of fins 61b, that is, different lengths in the air flow direction D. The coupling member 163 is attached to the fins 61a with different lengths. In this example, similarly to the first heat sink 61 described above, the first heat sink 161 is arranged in the vicinity of the cooling fan 40. The plurality of fins 61b includes, in its portion on the rear side of the cooling fan 40, front edges lined up on a curved line curved to match the outer circumference of the cooling fan 40 (refer to FIG. 6). The lengths of the plurality of fins 61b positioned to the rear of the cooling fan 40 therefore become gradually shorter toward the fins 61b at the end, that is, toward the straight line L2 passing through the rotation axis C of the cooling fan 40 (refer to FIG. 6). The coupling member 163 is attached to the plurality of such fins 61b with different lengths. The fins 61b have natural frequencies corresponding to the lengths thereof. By coupling a plurality of fins 61b having different natural frequencies from one another by the coupling member 163, vibrations of the coupling member 163 itself are less prone to be generated, and it is possible to reduce the vibrations of the fins 61b more effectively. Further, since the coupling member 163 is attached to all of the plurality of fins 61b with different lengths, even in a case where it is not clear which fin 61b having natural frequency vibrate violently, the vibrations of the fins 61b can be reliably reduced. In this example, as illustrated in FIG. 12, the coupling member 163 extends from the upper edge of the fin 61b positioned at one end to the fin 61b positioned at the other end, and the coupling member 163 is attached to all of the fins 61b.

The width of the coupling member 163 (width in the air flow direction D) is narrower than the width of any of the fins 61b (length in a direction along the fin 61b). It is therefore possible to restrain the coupling member 163 obstructing the diffusion of heat.

As illustrated in FIG. 12, the coupling member 163 includes a plurality of (in this example, three) protrusions 163b on the upper face thereof. By forming such protrusions 163b, even in a case where there are vibrations that the coupling member 163 cannot resolve, such vibrations are not easily transmitted via the coupling member 163 to the other members.

Further, similarly to the first heat sink 61 described above, the first heat sink 161 is arranged inside the cover 50. The protrusions 163b may be pressed against the lower face of the upper wall 52 of the cover 50 (refer to FIG. 3). In that structure, the adhesion strength between the coupling member 163 and the fins 61b increases, and vibrations can be reduced more effectively. Further, due to the presence of the protrusions 163b, a clearance can be reliably left between the coupling member 163 and the upper wall 52. As a result, an air flow can be formed on the upper side of the coupling member 163, and a rise in the temperature of the coupling member 163 can be suppressed. Alternatively, the protrusions 163b do not necessarily have to be provided.

Figure 14:
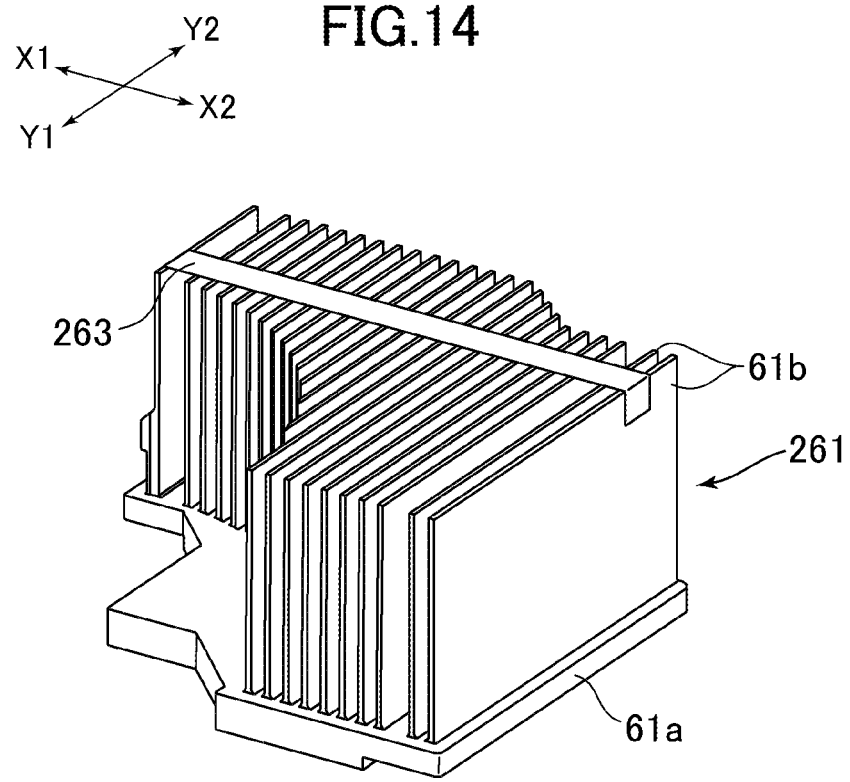

FIG. 14 is a diagram that illustrated still another example of the first heat sink 61, and in the drawing, a first heat sink 261 is illustrated. Here, points that differ from the first heat sink 161 will be described, while other points are the same as the first heat sinks 61 and 161 described above.

The first heat sink 261 in this example includes a strip-shaped coupling member 263. The coupling member 263 includes a surface in contact with the edges of the plurality of fins 61b, specifically, the upper edges thereof. That is, an adhesive is applied to the lower surface of the coupling member 263. By that structure, the vibrations of the fins 61b are reduced. Further, similarly to the coupling member 163, the coupling member 263 extends from the fin 61b at one end to the fin 61b at the other end. The ends of the coupling member 263 are pasted onto the side faces of the fins 61b at each end.

A cushioning material may be provided on the upper face of the coupling member 263. By that structure, it is possible to reduce the vibrations of the fins 61b more effectively.

Technical Advantages

As described above, according to the present embodiments, the inner edge of a hole 23 that surrounds the outer circumference of a first heat sink (metallic component) 61 includes two edges 23a and 23b (23c and 23d) that are positioned on opposite sides to each other with the first heat sink 61 positioned therebetween. An upper frame (shield) 20 includes spring portions 24 (26) on one edge 23a (23c) of the two edges, which are in contact with the first heat sink 61 to push the first heat sink 61 toward the other edge 23b (23d). Further, the upper frame 20 includes, on the other edge 23b (23d), a position determining portion 25 (27 and 28) to which the first heat sink 61 is pressed. According to that structure, the position of the first heat sink 61 can be defined by the upper frame 20, and the first heat sink 61 and the upper frame 20 can be made to be in contact stably.

Further, the position determining portion 25 (27 and 28) includes a protrusion 25a (27a and 28a) that protrudes toward the first heat sink 61. That configuration clears a point in the position determining portion 25 (27 and 28) to which the first heat sink 61 is in contact, and then the precision of the positioning of the first heat sink 61 can be secured.

Further, the upper frame 20 includes plural spring portions 24 (two spring portions 26) on the edge 23a (23c). The protrusion 25a (28a) of the position determining portion 25 (28) is positioned, across the first heat sink 61, on the opposite side to the position between the two spring portions 24 at both ends (two spring portions 26). This configuration can reduce the momentum on the first heat sink 61 due to the elasticity of the spring portions 24 (26).

Further, the protrusion 25a (28a) of the position determining portion 25 (28) is positioned, across the first heat sink 61, on the opposite side to an intermediate position of the two spring portions 24 at both ends (two spring portions 26). This configuration can further reduce the momentum on the first heat sink 61 due to the elasticity of the spring portions 24 (26).

Further, a hole 23 inside which the first heat sink 61 is arranged is formed on the upper frame 20, and the inner edge of the hole 23 includes the first edge 23a and the second edge 23b, and the third edge 23c and the fourth edge 23d that oppose each other in the orthogonal direction to the direction in which the first edge 23a and the second edge 23b are opposing. Furthermore, the upper frame 20 includes, on the third edge 23c, the spring portions 26 that are in contact with the first heat sink 61 to push the first heat sink 61 toward the fourth edge 23d. Further, the shield 20 includes, the fourth edge 23d, the position determining portions 27 and 28 to which the first heat sink 61 is pressed. According to that configuration, the position of the first heat sink 61 can be defined in the front and back direction and the left and right direction.

Further, a cooling fan 40 is arranged on the upper frame 20, and the position determining portion 25 projects toward a circuit board 10 from the edge 23b with the position determining portion 25. Further, the position determining portions 27 and 28 and the spring portions 26 project toward the circuit board 10 from the edges 23d and 23c on which the position determining portions 27 and 28 and the spring portions 26 are formed. According to such a configuration, the position determining portions 25, 27, and 28 and the spring portions 26 can be suppressed from obstructing the air flow.

The first heat sink 61 includes a heat receiving block 61a in contact with the electronic parts (IC chip 11) on the circuit board 10, and plural fins 61b formed on the heat receiving block 61a and positioned further upward than the upper frame 20. Furthermore, the heat receiving block 61a is pressed against the position determining portion 25 (27 and 28). According to such a configuration, compared to a structure in which the fins 61b are pressed against the position determining portion 25 (27 and 28), the precision of the positioning of the first heat sink 61 can be secured.

Further, the spring portions 24 protrude upward from the edge 23a to push the fin 61b positioned on the end of the plural fins 61b. According to that, it becomes easier to secure the lengths and number of the spring portions 24.

MODIFICATIONS

Here, the present invention is not limited to the embodiments described above, and various modifications are possible.

For example, the electronic apparatus described above includes the first heat sink 61 as an example of the metallic component described in the claims. However, the metallic component is not limited to a heat sink, and it is sufficient if the metallic component is a member which is arranged on a circuit board and from which electromagnetic waves emanate. The metallic component may be, for example, a connector that includes a metallic portion on its outer surface. Further, the metallic component may be a recording medium reading reproduction device that includes a metallic portion on its outer surface.

Further, the electronic apparatus described above includes the upper frame 20 that is fixed to a housing to thereby function as an example of the shield described in the claims. However, the shield is not necessarily a member that is fixed to a housing.

Further, in the description above, the first heat sink 61 is arranged in the hole 23, and the inner edge of the hole 23 includes the four edges 23*a*, 23*b*, 23*c*, and 23*d*. However, spring portions and position determining portions may be formed on only two edges of the four edges 23*a*, 23*b*, 23*c*, and 23*d* (for example, only the first edge 23*a* and the second edge 23*b*).

Further, in the description above, the cooling fan 40 is arranged such that the rotation axis C thereof is vertical to the circuit board 10. However, the layout of the cooling fan 40 is not limited thereto, and the cooling fan 40 may be arranged such that for example, the rotation axis C is parallel to the upper frame 20.

Further, the present invention may be applied to an electronic apparatus that does not include the cooling fan 40 or a cover 50.

What is claimed is:

1. An electronic apparatus comprising:
a circuit board;
a plate-like shield covering the circuit board;
a metallic component arranged on the circuit board;
an edge formed in the shield and surrounding an outer circumference of the metallic component, the edge including two edges that are positioned on opposite sides to each other with the metallic component positioned therebetween;
a spring portion formed on one edge of the two edges and in contact with the metallic component to push the metallic component toward the other edge; and
a rigid position determining portion formed on the other edge, the metallic component is pressed against the position determining portion.

2. The electronic apparatus according to claim 1, wherein the position determining portion includes a protrusion protruding to the metallic component.

3. The electronic apparatus according to claim 2, wherein the shield includes, on the one edge of the edges, at least two spring portions each serving as the spring portion, and
the protrusion of the position determining portion is positioned on an opposite side across the metallic component to the position between the at least two spring portions.

4. The electronic apparatus according to claim 3, wherein the protrusion of the position determining portion is positioned, across the metallic component, on an opposite side to an intermediate position of the at least two spring portions.

5. The electronic apparatus according to claim 1, wherein the shield has a hole formed therein in which the metallic component is arranged,
an inner edge of the hole includes a first edge and a second edge that respectively function as the at least two edges and the inner edge of the hole includes a third edge and a fourth edge that oppose each other in a direction orthogonal to a direction in which the first edge and the second edge oppose each other,
the shield includes, on the third edge, a spring portion that is in contact with the metallic component to push the metallic component toward the fourth edge, and
the shield includes a position determining portion on the fourth edge, wherein the metallic component is pressed against the fourth edge.

6. The electronic apparatus according to claim 1, wherein a cooling fan is arranged on the shield, and
at least one of the spring portion and the position determining portion protrudes toward the circuit board from an edge on which at least one thereof is formed.

7. The electronic apparatus according to claim 1, wherein the metallic component is a heat sink,
the heat sink includes a heat receiving block in contact with an electronic part on the circuit board, and a plurality of fins formed on the heat receiving block and positioned further upward than the shield, and
the heat receiving block is pressed against the position determining portion.

8. The electronic apparatus according to claim 7, wherein the spring portion protrudes upward from the one edge of the two edges and pushes a fin positioned at an end of the plurality of fins.

9. An electronic apparatus comprising:
a circuit board;
a plate-like shield covering the circuit board;
a metallic component arranged on the circuit board;
an edge formed in the shield and surrounding an outer circumference of the metallic component, the edge including two edges that are positioned on opposite sides to each other with the metallic component positioned therebetween;
a spring portion formed on one edge of the two edges and in contact with the metallic component to push the metallic component toward the other edge; and
a position determining portion formed on the other edge, the metallic component is pressed against the position determining portion,
wherein the position determining portion includes a protrusion protruding to the metallic component.

10. The electronic apparatus according to claim 9, wherein the shield includes, on the one edge of the edges, at least two spring portions each serving as the spring portion, and
the protrusion of the position determining portion is positioned on an opposite side across the metallic component to the position between the at least two spring portions.

11. The electronic apparatus according to claim 10, wherein
the protrusion of the position determining portion is positioned, across the metallic component, on an opposite side to an intermediate position of the at least two spring portions.

12. The electronic apparatus according to claim 9, wherein the shield has a hole formed therein in which the metallic component is arranged,
an inner edge of the hole includes a first edge and a second edge that respectively function as the at least two edges and the inner edge of the hole includes a third edge and a fourth edge that oppose each other in a direction orthogonal to a direction in which the first edge and the second edge oppose each other, the shield includes, on the third edge, a spring portion that is in contact with the metallic component to push the metallic component toward the fourth edge, and the shield includes a position determining portion on the fourth edge, wherein the metallic component is pressed against the fourth edge.

13. The electronic apparatus according to claim 9, wherein a cooling fan is arranged on the shield, and at least one of the spring portion and the position determining portion protrudes toward the circuit board from an edge on which at least one thereof is formed.

14. The electronic apparatus according to claim 9, wherein the metallic component is a heat sink, the heat sink includes a heat receiving block in contact with an electronic part on the circuit board, and a plurality of fins formed on the heat receiving block and positioned further upward than the shield, and the heat receiving block is pressed against the position determining portion.

15. The electronic apparatus according to claim 14, wherein the spring portion protrudes upward from the one edge of the two edges and pushes a fin positioned at an end of the plurality of fins.

* * * * *